(12) United States Patent
Bertness

(10) Patent No.: US 6,441,585 B1
(45) Date of Patent: Aug. 27, 2002

(54) APPARATUS AND METHOD FOR TESTING RECHARGEABLE ENERGY STORAGE BATTERIES

(75) Inventor: Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 09/595,102

(22) Filed: Jun. 15, 2000

Related U.S. Application Data

(60) Provisional application No. 60/139,439, filed on Jun. 16, 1999.

(51) Int. Cl.[7] .................... H01M 10/44; G10N 27/416
(52) U.S. Cl. ...................... 320/132; 324/426
(58) Field of Search ................. 320/132, 149, 320/DIG. 21; 324/426, 427, 430, 433, 446

(56) References Cited

U.S. PATENT DOCUMENTS

| | | | |
|---|---|---|---|
| 2,514,745 A | 7/1950 | Dalzell | 171/95 |
| 3,356,936 A | 12/1967 | Smith | 324/29.5 |
| 3,562,634 A | 2/1971 | Latner | 31/4 |
| 3,593,099 A | 7/1971 | Scholl | 320/13 |
| 3,607,673 A | 9/1971 | Seyl | 204/1 |
| 3,676,770 A | 7/1972 | Sharaf et al. | 324/29.5 |
| 3,729,989 A | 5/1973 | Little | 73/133 |
| 3,753,094 A | 8/1973 | Furuishi et al. | 324/29.5 |
| 3,808,522 A | 4/1974 | Sharaf | 324/29.5 |
| 3,811,089 A | 5/1974 | Strezelewicz | 324/170 |
| 3,873,911 A | 3/1975 | Champlin | 324/29.5 |

(List continued on next page.)

FOREIGN PATENT DOCUMENTS

| | | |
|---|---|---|
| DE | 29 26 716 B1 | 1/1981 |
| EP | 0 022 450 A1 | 1/1981 |
| EP | 0 637 754 A1 | 2/1995 |
| EP | 0 772 056 A1 | 5/1997 |
| FR | 2 749 397 | 12/1997 |
| GB | 2 088 159 A | 6/1982 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04131779 | 5/1992 |
| JP | 04372536 | 12/1992 |
| JP | 5216550 | 8/1993 |
| JP | 7-128414 | 5/1995 |
| WO | WO 93/22666 | 11/1993 |
| WO | WO 94/05069 | 3/1994 |
| WO | WO 98/58270 | 12/1998 |
| WO | WO 99/23738 | 5/1999 |

OTHER PUBLICATIONS

European Patent Application 80101949.8, Robert Bosch GmbH. no date.*
"Electrochemical Impedance Spectroscopy in Battery Development and Testing", *Batteries International*, Apr. 1997, pp. 59 and 62–63.
"Battery Impedance", by E. Willihnganz et al., *Electrical Engineering*, Sept. 1959, pp. 922–925.
"Determining The End of Battery Life", by S. DeBardelaben, *IEEE*, 1986, pp. 365–368.
"A Look at the Impedance of a Cell", by S. Debardelaben, *IEEE*, 1988, pp. 394–397.
"The Impedance of Electrical Storage Cells", by N.A. Hampson et al., *Journal of Applied Electrochemistry*, 1980, pp. 3–11.
"A Package for Impedance/Admittance Data Analysis", by B. Boukamp, *Solid State Ionics*, 1986, pp. 136–140.
"Precision of Impedance Spectroscopy Estimates of Bulk, Reaction Rate, and Diffusion Parameters", by J. Macdonald et al., *J. Electroanal, Chem.*, 1991, pp. 1–11.
"Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128, 131.
IEEE Recommended Practice For Maintenance, Testings, and Replacement of Large Lead Storage Batteries for Generating Stations and Substations, *The Institute of Electrical and Electronics Engineers, Inc.,* ANSI/IEEE Std. 450–1987, Mar. 9, 1987, pp. 7–15.
"Field and Laboratory Studies to Assess the State of Health of Valve–Regulated Lead Acid Batteries: Part I Conductance/Capacity Correlation Studies", by D. Feder et al., *IEEE* Aug. 1992, pp. 218–233.
"Battery Impedance", by E. Willihnganz et al., *Electrical Engineering*, Sept. 1959, pp. 922–925.

(List continued on next page.)

Primary Examiner—Edward H. Tso
(74) Attorney, Agent, or Firm—Westman, Champlin & Kelly, P.A.

(57) ABSTRACT

An improved battery testing system and method is disclosed. The system measures an open circuit voltage and a dynamic parameter of a test battery, and uses those measurements, along with correlation data stored in memory, to determine a physical condition and/or charge state of the battery. The measured dynamic parameter may be scaled based on the rating of the test battery. Also, a high current load pulse may be applied to the test battery and a wait period implemented before the open circuit voltage is measured. In addition, the charge state may be determined from a state of charge value, and categorized into one of several charge state ranges. In one embodiment, the state of charge value is determined from the relative distance along a curve, represented by the correlation data stored in memory, that the measured open circuit voltage is not greater than or equal to such correlation data.

34 Claims, 19 Drawing Sheets

U.S. PATENT DOCUMENTS

| | | | |
|---|---|---|---|
| 3,876,931 A | 4/1975 | Godshalk | 324/29.5 |
| 3,886,443 A | 5/1975 | Miyakawa et al. | 324/29.5 |
| 3,889,248 A | 6/1975 | Ritter | 340/249 |
| 3,906,329 A | 9/1975 | Bader | 320/44 |
| 3,909,708 A | 9/1975 | Champlin | 324/29.5 |
| 3,936,744 A | 2/1976 | Perlmutter | 324/158 |
| 3,946,299 A | 3/1976 | Christianson et al. | 320/43 |
| 3,947,757 A | 3/1976 | Grube et al. | 324/28 |
| 3,969,667 A | 7/1976 | McWilliams | 324/29.5 |
| 3,979,664 A | 9/1976 | Harris | 324/17 |
| 3,984,762 A | 10/1976 | Dowgiallo, Jr. | 324/29.5 |
| 3,984,768 A | 10/1976 | Staples | 324/62 |
| 3,989,544 A | 11/1976 | Santo | 429/65 |
| 4,008,619 A | 2/1977 | Alcaide et al. | 73/398 |
| 4,047,091 A | 9/1977 | Hutchines et al. | 363/59 |
| 4,053,824 A | 10/1977 | Dupuis et al. | 324/29.5 |
| 4,070,624 A | 1/1978 | Taylor | 327/158 |
| 4,086,531 A | 4/1978 | Bernier | 324/158 |
| 4,112,351 A | 9/1978 | Back et al. | 324/16 |
| 4,114,083 A | 9/1978 | Benham et al. | 320/39 |
| 4,126,874 A | 11/1978 | Suzuki et al. | 354/60 |
| 4,178,546 A | 12/1979 | Hulls et al. | 324/158 |
| 4,193,025 A | 3/1980 | Frailing et al. | 324/427 |
| 4,207,611 A | 6/1980 | Gordon | 364/580 |
| 4,217,645 A | 8/1980 | Barry et al. | 364/483 |
| 4,297,639 A | 10/1981 | Branham | 324/429 |
| 4,315,204 A | 2/1982 | Sievers et al. | 322/28 |
| 4,316,185 A | 2/1982 | Watrous et al. | 340/636 |
| 4,322,685 A | 3/1982 | Frailing et al. | 324/429 |
| 4,351,405 A | 9/1982 | Fields et al. | 180/65 |
| 4,363,407 A | 12/1982 | Barkler et al. | 209/3.3 |
| 4,369,407 A | 1/1983 | Korbell | 324/416 |
| 4,379,989 A | 4/1983 | Kurz et al. | 320/26 |
| 4,379,990 A | 4/1983 | Sievers et al. | 322/99 |
| 4,390,828 A | 6/1983 | Converse et al. | 320/32 |
| 4,392,101 A | 7/1983 | Saar et al. | 320/20 |
| 4,396,880 A | 8/1983 | Windebank | 320/21 |
| 4,408,157 A | 10/1983 | Beaubien | 324/62 |
| 4,412,169 A | 10/1983 | Dell'Orto | 320/64 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/158 |
| 4,514,694 A | 4/1985 | Finger | 324/429 |
| 4,520,353 A | 5/1985 | McAuliffe | 340/636 |
| 4,633,418 A | 12/1986 | Bishop | 364/554 |
| 4,659,977 A | 4/1987 | Kissel et al. | 320/64 |
| 4,663,580 A | 5/1987 | Wortman | 320/35 |
| 4,667,143 A | 5/1987 | Cooper et al. | 320/22 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/32 |
| 4,697,134 A | 9/1987 | Burkum et al. | 320/48 |
| 4,707,795 A | 11/1987 | Alber et al. | 364/550 |
| 4,709,202 A | 11/1987 | Koenck et al. | 320/43 |
| 4,710,861 A | 12/1987 | Kanner | 363/46 |
| 4,719,428 A | 1/1988 | Liebermann | 324/436 |
| 4,743,855 A | 5/1988 | Randin et al. | 324/430 |
| 4,745,349 A | 5/1988 | Palanisamy et al. | 320/22 |
| 4,816,768 A | 3/1989 | Champlin | 324/428 |
| 4,820,966 A | 4/1989 | Fridman | 320/32 |
| 4,825,170 A | 4/1989 | Champlin | 324/436 |
| 4,847,547 A | 7/1989 | Eng, Jr. et al. | 320/35 |
| 4,849,700 A | 7/1989 | Morioka et al. | 324/427 |
| 4,876,495 A | 10/1989 | Palanisamy et al. | 320/18 |
| 4,881,038 A | 11/1989 | Champlin | 324/426 |
| 4,912,416 A | 3/1990 | Champlin | 324/430 |
| 4,913,116 A | 4/1990 | Katogi et al. | 123/425 |
| 4,929,931 A | 5/1990 | McCuen | 340/636 |
| 4,931,738 A | 6/1990 | MacIntyre et al. | 324/435 |
| 4,937,528 A | 6/1990 | Palanisamy | 324/430 |
| 4,947,124 A | 8/1990 | Hauser | 324/430 |
| 4,956,597 A | 9/1990 | Heavey et al. | 320/14 |
| 4,968,941 A | 11/1990 | Rogers | 324/428 |
| 4,968,942 A | 11/1990 | Palanisamy | 324/430 |
| 5,004,979 A | 4/1991 | Marino et al. | 324/160 |
| 5,032,825 A | 7/1991 | Xuznicki | 340/636 |
| 5,047,722 A | 9/1991 | Wurst et al. | 324/430 |
| 5,087,881 A | 2/1992 | Peacock | 324/378 |
| 5,095,223 A | 3/1992 | Thomas | 307/110 |
| 5,126,675 A | 6/1992 | Yang | 324/435 |
| 5,140,269 A | 8/1992 | Champlin | 324/433 |
| 5,144,218 A | 9/1992 | Bosscha | 320/44 |
| 5,144,248 A | 9/1992 | Alexandres et al. | 324/428 |
| 5,160,881 A | 11/1992 | Schramm et al. | 322/7 |
| 5,170,124 A | 12/1992 | Blair et al. | 324/434 |
| 5,179,335 A | 1/1993 | Nor | 320/21 |
| 5,194,799 A | 3/1993 | Tomantschger | 320/2 |
| 5,204,611 A | 4/1993 | Nor et al. | 320/21 |
| 5,214,370 A | 5/1993 | Harm et al. | 320/35 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/14 |
| 5,281,919 A | 1/1994 | Palanisamy | 324/427 |
| 5,281,920 A | 1/1994 | Wurst | 324/430 |
| 5,295,078 A | 3/1994 | Stich et al. | 364/483 |
| 5,298,797 A | 3/1994 | Redl | 307/246 |
| 5,300,874 A | 4/1994 | Shimamoto et al. | 320/15 |
| 5,302,902 A | 4/1994 | Groehl | 324/434 |
| 5,315,287 A | 5/1994 | Sol | 340/455 |
| 5,321,626 A | 6/1994 | Palladino | 364/483 |
| 5,331,268 A | 7/1994 | Patino et al. | 320/20 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/35 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/35 |
| 5,365,160 A | 11/1994 | Leppo et al. | 320/22 |
| 5,365,453 A | 11/1994 | Startup et al. | 364/481 |
| 5,381,096 A | 1/1995 | Hirzel | 324/427 |
| 5,412,323 A | 5/1995 | Kato et al. | 324/427 |
| 5,426,371 A | 6/1995 | Salley et al. | 324/429 |
| 5,426,416 A | 6/1995 | Jefferies et al. | 340/664 |
| 5,432,426 A | 7/1995 | Yoshida | 320/20 |
| 5,434,495 A | 7/1995 | Toko | 320/44 |
| 5,435,185 A | 7/1995 | Eagan | 73/587 |
| 5,442,274 A | 8/1995 | Tamai | 320/23 |
| 5,445,026 A | 8/1995 | Eagan | 73/591 |
| 5,449,996 A | 9/1995 | Matsumoto et al. | 320/20 |
| 5,449,997 A | 9/1995 | Gilmore et al. | 320/39 |
| 5,451,881 A | 9/1995 | Finger | 324/433 |
| 5,457,377 A | 10/1995 | Jonsson | 320/5 |
| 5,469,043 A | 11/1995 | Cherng et al. | 320/31 |
| 5,485,090 A | 1/1996 | Stephens | 324/433 |
| 5,488,300 A | 1/1996 | Jamieson | 324/432 |
| 5,519,383 A | 5/1996 | De La Rosa | 340/636 |
| 5,528,148 A | 6/1996 | Rogers | 324/426 |
| 5,537,967 A | 7/1996 | Tashiro et al. | 123/792.1 |
| 5,546,317 A | 8/1996 | Andrieu | 364/481 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,572,136 A | 11/1996 | Champlin | 324/426 |
| 5,574,355 A | 11/1996 | McShane et al. | 320/39 |
| 5,583,416 A | 12/1996 | Klang | 320/22 |
| 5,585,728 A * | 12/1996 | Champlin | 324/427 |
| 5,589,757 A | 12/1996 | Klang | 320/22 |

| | | | |
|---|---|---|---|
| 5,592,093 A | 1/1997 | Klingbiel | 324/426 |
| 5,596,260 A | 1/1997 | Moravec et al. | 320/30 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/48 |
| 5,621,298 A | 4/1997 | Harvey | 320/5 |
| 4,024,953 A | 5/1997 | Nailor, III | 206/344 |
| 5,633,985 A | 5/1997 | Severson et al. | 395/2.76 |
| 5,637,978 A | 6/1997 | Kellett et al. | 320/2 |
| 5,642,031 A | 6/1997 | Brotto | 320/21 |
| 5,650,937 A | 7/1997 | Bounaga | 364/483 |
| 5,652,501 A | 7/1997 | McClure et al. | 320/17 |
| 5,653,659 A | 8/1997 | Kunibe et al. | 477/111 |
| 5,656,920 A | 8/1997 | Cherng et al. | 320/31 |
| 5,675,234 A | 10/1997 | Greene | 320/15 |
| 5,677,077 A | 10/1997 | Faulk | 429/90 |
| 5,699,050 A | 12/1997 | Kanazawa | 340/636 |
| 5,701,089 A | 12/1997 | Perkins | 327/772 |
| 5,705,929 A | 1/1998 | Caravello et al. | 324/430 |
| 5,710,503 A | 1/1998 | Sideris et al. | 320/6 |
| 5,717,336 A | 2/1998 | Basell et al. | 324/430 |
| 5,717,937 A | 2/1998 | Fritz | 395/750.01 |
| 5,739,667 A | 4/1998 | Matsuda et al. | 320/5 |
| 5,747,909 A | 5/1998 | Syverson et al. | 310/156 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,773,978 A | 6/1998 | Becker | 324/430 |
| 5,789,899 A | 8/1998 | van Phuoc et al. | 320/30 |
| 5,793,359 A | 8/1998 | Ushikubo | 345/169 |
| 5,808,469 A | 9/1998 | Kopera | 324/43.4 |
| 5,818,234 A | 10/1998 | McKinnon | 324/433 |
| 5,821,756 A | 10/1998 | McShane et al. | 324/430 |
| 5,825,174 A | 10/1998 | Parker | 324/106 |
| 5,831,435 A | 11/1998 | Troy | 324/426 |
| 5,862,515 A | 1/1999 | Kobayashi et al. | 702/63 |
| 5,872,443 A | 2/1999 | Williamson | 320/21 |
| 5,895,440 A | 4/1999 | Proctor et al. | 702/63 |
| 5,914,605 A | 6/1999 | Bertness | 324/430 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | |
| 5,945,829 A | 8/1999 | Bertness | 324/430 |
| 5,969,625 A | 10/1999 | Russo | 340/636 |
| 6,002,238 A | 12/1999 | Champlin | 320/134 |
| 6,008,652 A | 12/1999 | Theofanopoulos et al. | 324/434 |
| 6,009,369 A | 12/1999 | Boisvert et al. | 701/99 |
| 6,031,354 A | 2/2000 | Wiley et al. | 320/116 |
| 6,037,751 A | 3/2000 | Klang | 320/160 |
| 6,037,777 A | 3/2000 | Champlin | 324/430 |
| 6,051,976 A | 4/2000 | Bertness | 324/426 |
| 6,072,299 A | 6/2000 | Kurie et al. | 320/112 |
| 6,072,300 A | 6/2000 | Tsuji | 320/116 |
| 6,081,098 A | 6/2000 | Bertness et al. | 320/134 |
| 6,091,245 A | 7/2000 | Bertness | 324/426 |
| 6,094,033 A | 7/2000 | Ding et al. | 320/132 |
| 6,104,167 A | 8/2000 | Bertness et al. | 320/132 |
| 6,114,834 A | 9/2000 | Parise | 320/109 |
| 6,137,269 A | 10/2000 | Champlin | 320/150 |
| 6,140,797 A | 10/2000 | Dunn | 320/105 |
| 6,150,793 A | 11/2000 | Lesesky et al. | 320/104 |
| 6,161,640 A | 12/2000 | Yamaguchi | 180/65.5 |
| 6,163,156 A * | 12/2000 | Bertness | 324/426 |
| 6,172,483 B1 | 1/2001 | Champlin | 320/134 |
| 6,172,505 B1 | 1/2001 | Bertness | 324/430 |
| 6,181,545 B1 | 1/2001 | Amatucci et al. | 361/502 |
| 6,222,369 B1 | 4/2001 | Champlin | 324/430 |
| 6,225,808 B1 | 5/2001 | Varghese et al. | 324/426 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,254 B1 | 7/2001 | Klang | 324/427 |
| 6,262,563 B1 | 7/2001 | Champlin | 320/134 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,310,481 B2 | 10/2001 | Bertess | 324/430 |
| 6,313,607 B1 | 11/2001 | Champlin | 320/132 |
| 6,313,608 B1 | 11/2001 | Varghese et al. | 32/132 |
| 6,316,914 B1 | 11/2001 | Bertness | 320/134 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |

OTHER PUBLICATIONS

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

National Semiconductor Corporation, "High Q Notch Filter", Mar. 1969, Linear Brief 5, Mar. 1969.

Burr–Brown Corporation, "Design A 60 Hz Notch Filter with the UAF42", Jan. 1994, AB–071, 1994.

National Semiconductor Corporation, "LMF90–4$^{th}$–Order Elliptic Notch Filter", Dec. 1994, RRD–B30M115, Dec. 1994.

"Alligator Clips with Wire Penetrators" *J.S. Popper, Inc.* product information, downloaded from http://www.jspopper.com/, undated.

"#12: LM78S40 Simple Switcher DC to DC Converter", *ITM e–Catalog*, downloaded from http://www.pcbcafe.com, undated.

"Simple DC–DC Converts Allows Use of Single Battery", *Electronix Express*, downloaded from http://www.elexp.com/t_dc–dc.htm, undated.

"DC–DC Converter Basics", *Power Designers*, downloaded from http://www.powederdesigners.com/InforWeb.design_center/articles/DC–DC/converter.shtm, undated.

* cited by examiner

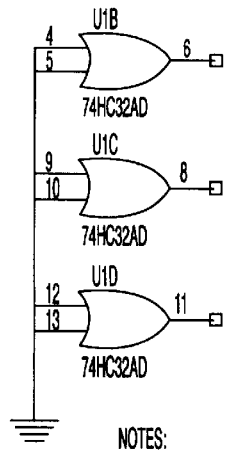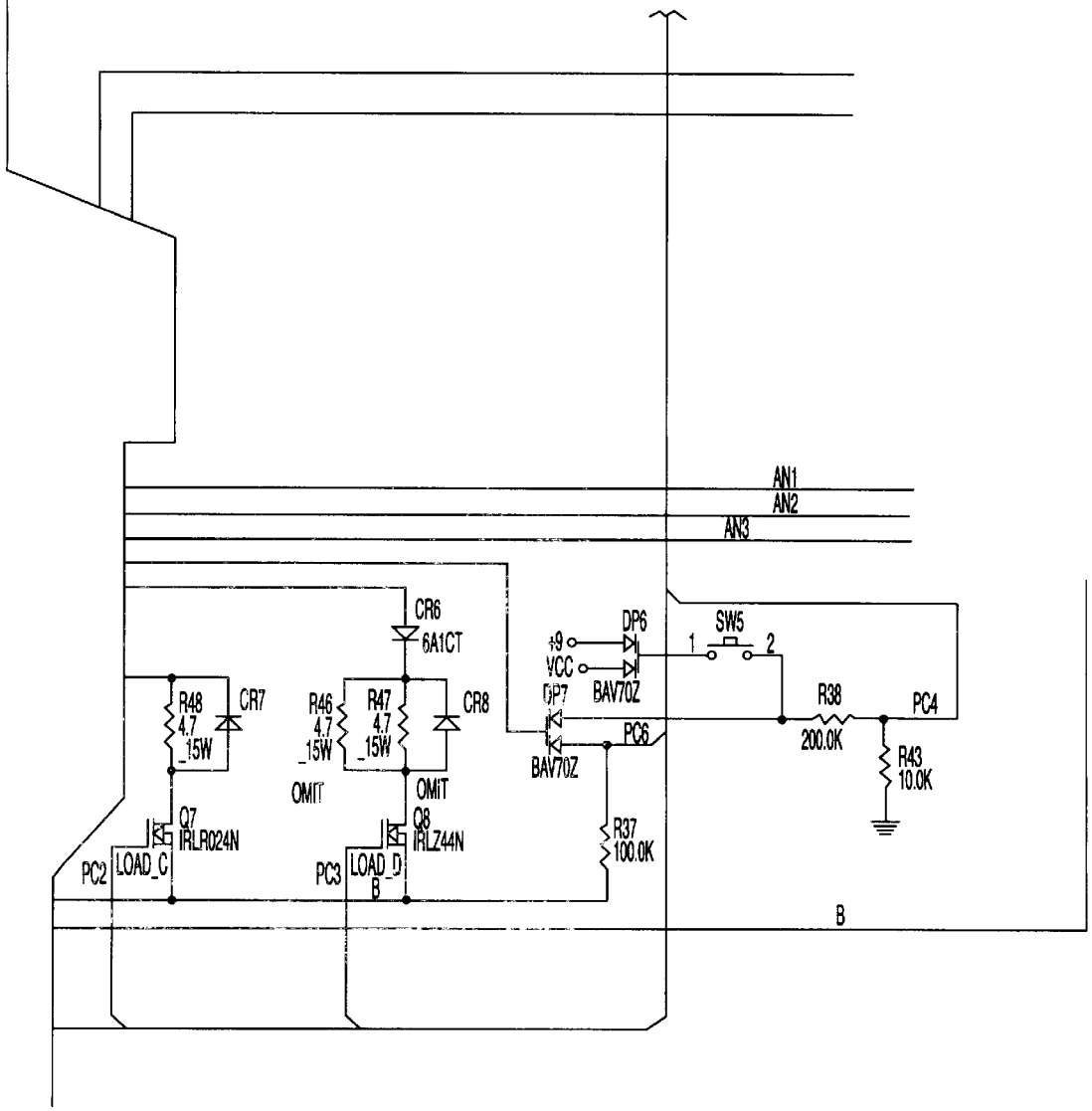
FIG. 1A-2

FIG 1B

Bill of Materials

| Item | Qty | Reference | MatchKey | Critical Part | House Number | Part | DESCRIPTION |
|---|---|---|---|---|---|---|---|
| 1 | 3 | CR1,CR2,CR3 | S1BDICT | | | S1BDICT-ND | Rect, 100V/1A, (sm |
| 2 | 1 | CR4 | ZM4752ACT | | | ZM4752ACT | 33v Zener, 1W (sm) |
| 3 | 2 | CR6,CR5 | 6A1CT | | | 6A1CT | 100V/6A GP Rectifier |
| 4 | 2 | CR8,CR7 | S1BDICT_OMIT | | | S1BDICT-ND | Rect, 100V/1A, (sm) |
| 5 | 1 | C1 | 6.8UF_6.3V | | | 6.8UF/6.3V | Tant cap, THE (sm) |
| 6 | 1 | C2 | .015UF_SM | | | D-K PCC153BCT | .015UF Ceramic X7R (sm) |
| 7 | 12 | C3,C4,C7,C10,C11,C12,C15 C16,C17,C20,C23,C24 | .047UF_SM | | | D-K PCC473BCT | .047UF/50V Ceramic (sm) |
| 8 | 2 | C6,C5 | 15PF_SM | | | DK 9CC150CNCT | 15PF/50V NPO Ceramic (sm) |
| 9 | 3 | C8,C9,C18 | .22UF_SMF | | | D-K P4540 | .22UF/63V Metalized Film |
| 10 | 1 | C13 | 100PF_SM | | | D-K PCC101CCT-ND | 100PF/50V NPO Ceramic sm |
| 11 | 1 | C14 | 100UF_6.3VRAD | | | D-K P6201-ND | 100UF/6.3V SU Alum Radial |
| 12 | 1 | C19 | 10UF/6.3_SM | | | PCS1106CT-ND | 10 MFD/6.3V, tant (sm) |
| 13 | 1 | C21 | .01UF_SM | | | D-K PCC103BCT | .01UF/50V Cera X7R (sm) |
| 14 | 1 | C22 | 4.7UF_16VTANT_SM | | | D-K PCT3475CT-ND | 4.7UF/16V Tant (sm) |
| 15 | 5 | DP1,DP4,DP5,DP6,DP7 | BAV70Z | | | BAC70ZCCT-ND | (2-CC) Sw diode, 100ma/70v, (sm) |
| 16 | 2 | DP3,DP2 | BAW56Z | | | BAW56ZXCT-ND | (2-ca) Sw diode, 100ma/70v, (sm) |
| 17 | 1 | DP8 | BAV70Z_OMIT | | | BAV70ZXCT-ND | (2-CC) Sw diode, 100ma/70v, (sm) |
| 18 | 1 | J1 | DB9S_RA | | | D-K A2100-ND | DB9 Female RA PC Mtg |
| 19 | 1 | J2 | CON6X1X100_OMIT | | Amp 745781-4 | D-K WM4204 | Header 6 position 0.100 |
| 20 | 1 | J3 | CON2_S_KEYED | | | D-K WM4200 | Header, 2 Pins, 0.1in |
| 21 | 1 | J4 | CON14_S_.165 | | | D-K ED7014 | Strip Socket, 14 Pins, 0.1in |
| 22 | 1 | N1 | NOTE5H | | | Robertson Nugent | 44 Pin PLCC socket for 68HC705 |
| 23 | 1 | N2 | NOTE9E | | | Omron B22-12xx | Switch Cap for SW1-SW5 Qty 5 |
| 24 | 1 | N3 | NOTE6C | | | EW16215GR-W | LCD Micro Euro display |
| 25 | 1 | P1 | JACK_MOD4 | | Amp 555980-1 | D-K A9047-ND | 4 Pin Modular Connector |
| 26 | 2 | Q2, Q1 | FMMT3904CT | | | D-K FMMT3904CT | NPN 40V/200ma SOT23 (sm) |
| 27 | 1 | Q3 | FMMT3906CT | | | D-K FMMT3906CT | PNP 60V/200ma SOT23 (sm) |
| 28 | 1 | Q4 | DS1233-5_SOT | | | Dallas DS1233Z-5 (sot223) | Watchdog (sm) |
| 29 | 3 | Q5,Q6,Q7 | IRLR024N | | | D-K IRLR024N-ND | N CH Mosfet 16A, 55V (sm) |
| 30 | 1 | Q8 | IRLZ44N | | | IRLZ44N | N CH Mosfet 47A, 55V TO2201AB |
| 31 | 4 | RP1,RP2,RP3,RP4 | 100K_CHIP_SM | | | CTS 745101104J | 100K 8 res, 10 Pin (sm) |
| 32 | 1 | R1 | 2.2K_SM | | | D-K P2.2KACT | 2.2K ohm, 1/10W, 5% MF (sm) |
| 33 | 1 | R2 | 18_SM | | | D-K P18ACT | 18 ohm, 1/10W, 5% MF (sm) |
| 34 | 10 | R3,R7,R9,R16,R32,R36,R39 R40,R41,R43 | 10.0K_SM | | | D-K P10.0KCCT | 10.0K, 1/10W, 1% MF (sm) |
| 35 | 1 | R4 | 806-SM | | | D-K P806CCT | 806 ohm, 1/10W, 1% MF (sm) |
| 36 | 1 | R5 | 10_SM | | | D-K P10ACT | 10 ohm, 1/10W, 5% MF (sm) |
| 37 | 13 | R6,R11,R18,R19,R20,R21, R24,R26,R27,R28,R29, R35,R37 | 100.0K-SM | | | D-K P104CCT | 100.0K 1/10W, 1%, 0805 (sm) |

Bill of Materials

| Item | Qty | Reference | MatchKey | Critical Part | House Number | Part | DESCRIPTION |
|---|---|---|---|---|---|---|---|
| 38 | 1 | R8 | 0_OHM_OMIT | | | D-K 0.0Ω | 0 ohm Jumper |
| 39 | 3 | R10,R13,R33 | 1.87K_SM | | | D-K P1.87KCCT | 1.87K, 1/10W, 1% MF (sm) |
| 40 | 2 | R42,R12 | 10M_1/8W | | | D-K 10ME-BK-ND | 10M ohm, 1/8W, 5% F.C. |
| 41 | 3 | R14,R15,R31 | 4.75K_SM | | | D-K P4.75KCCT | 4.75K, 1/10W, 1% MF (sm) |
| 42 | 1 | R17 | OMIT_100.0K_SM | | | D-K P104CCT | 100.0K, 1/10W, 1%, 0805 (sm) |
| 43 | 4 | R22,R23,R25,R30 | 1.0M_SM | | | D-K P1.00MCCT | 1.00M, 1/10W, 1% MF (sm) |
| 44 | 1 | R34 | 1.0K_SM | | | D-K P1.00KCCT | 1.00K, 1/410W, 1%, MF (sm) |
| 45 | 1 | R38 | 200.0K_SM | | | D-K P200.0KCCT | 200.0K, 1/10W, 1% MF (sm) |
| 46 | 3 | R44,R45,R49 | 18_5W | | | D-K 18W-5-ND | 18 ohm, 5W, Sandbox |
| 47 | 3 | R46,R47,R48 | 4.7_15W | | | Ohmite TUW15J4R7 | 4.7 Ohm, 5%, 15W, W.W. |
| 48 | 5 | SW1,SW2,SW3,SW4,SW5 | OMRON_SWA | | D-K SW414 | Omron B3F-4055 | PB Switch |
| 49 | 1 | U1 | 74HC32AD | | | Motorola MM74HC32AD | 4-2 OR Gate (sm) |
| 50 | 1 | U2 | HSDL-70001 | | | HP HSDL-7001 | IR 3/16 Encode/Decode |
| 51 | 1 | U3 | LM324AM | | | National LM324AM | GP Quad Op Amp (sm) |
| 52 | 2 | U4, U6 | 74HC273ADW | | | Mot MC74HC273ADW | Octal D FF (sm) |
| 53 | 1 | U5 | STK15C68 | | | Simtek STK15C68 | 8Kx8 nvSRAM, CMOS |
| 54 | 1 | U7 | LM336M_2.5 | | | National LM336M-2.5 | 2.5V Refereboe (sm) |
| 55 | 1 | U8 | 145051DW | | | Mot MC145051DW | A/D Converter (sm) |
| 56 | 1 | U9 | 68HC705C9AFN | | | Mot MC68HC705C9AFN | CPU, 8 bit, (plcc 44) |
| 57 | 1 | U10 | OMIT_93C66_SOIC | | | Microchip 93LC66/P | Eeprom, sm |
| 58 | 1 | VR1 | LM2936Z_5 | | | LM2936Z-5.0 | 5VPos Reg TO92 |
| 59 | 1 | Y1 | 3.6864Mhz | | | D-K CTX071-ND | 3.6854 Mhz, CH49, crystal |
| 60 | 1 | Y2 | XTAL2 | | 4.00MHz | P'sonic EFO-EC4004a4 | Ceramic Resonator |

END

*FIG 1C*

| BATTERY # DEL | CCA 600 | RC | TRC 45 | | | |
|---|---|---|---|---|---|---|
| TEST CONDITION | AH REMOVED | MICRO 400 VDC | MICRO 400 CCA | MICRO 800 VDC | MICRO 800 CCA | CELLTRON VDC | CELLTRON+ KMHOS |
| INITIAL | 0% | | | | | | |
| CHARGED | 0% | 13.17 | 790 | 13.12 | 790 | 13.14 | 1.61 |
| DISCHARGE 1 | 10% | 12.61 | 778 | 12.69 | 764 | 12.72 | 1.61 |
| 30 MIN REST | | 12.91 | 772 | 12.91 | 764 | 12.91 | 1.59 |
| DISCHARGE 2 | 20% | 12.52 | 754 | 12.57 | 746 | 12.59 | 1.57 |
| 30 MIN REST | | 12.78 | 751 | 12.79 | 741 | 12.77 | 1.57 |
| DISCHARGE 3 | 30% | 12.42 | 733 | 12.46 | 724 | 12.48 | 1.53 |
| 30 MIN REST | | 12.65 | 733 | 12.66 | 719 | 12.66 | 1.54 |
| DISCHARGE 4 | 40% | 12.32 | 697 | 12.37 | 697 | 12.38 | 1.47 |
| 30 MIN REST | | 12.58 | 697 | 12.57 | 697 | 12.57 | 1.48 |
| DISCHARGE 5 | 50% | 12.23 | 656 | 12.29 | 658 | 12.31 | 1.38 |
| 30 MIN REST | | 12.48 | 659 | 12.49 | 662 | 12.49 | 1.4 |
| DISCHARGE 6 | 60% | 12.16 | 614 | 12.21 | 622 | 12.21 | 1.3 |
| 30 MIN REST | | 12.45 | 626 | 12.45 | 631 | 12.45 | 1.34 |
| DISCHARGE 7 | 70% | 12.07 | 560 | 12.13 | 574 | 12.14 | 1.2 |
| 30 MIN REST | | 12.32 | 575 | 12.34 | 582 | 12.35 | 1.24 |
| DISCHARGE 8 | 80% | 11.97 | 500 | 12.02 | 516 | 12.04 | 1.07 |
| 30 MIN REST | | 12.25 | 515 | 12.27 | 529 | 12.28 | 1.13 |
| DISCHARGE 9 | 90% | 11.83 | 432 | 11.9 | 450 | 11.92 | 0.947 |
| 30 MIN REST | | 12.2 | 468 | 12.19 | 481 | 12.2 | 1.01 |
| DISCHARGE 10 | 100% | 11.64 | 342 | 11.69 | 366 | 11.74 | 0.779 |
| 30 MIN REST | | 12.2 | 462 | 12.21 | 472 | 12.2 | 1.06 |
| DISCHARGE 11 | 110% | 11.47 | 259 | 11.56 | 287 | 11.61 | 0.642 |
| 30 MIN REST | | 12.03 | 342 | 12.04 | 357 | 12.04 | 0.783 |
| DISCHARGE 12 | 120% | | | | | | |
| 30 MIN REST | | | | | | | |
| DISCHARGE 13 | 130% | | | | | | |
| 30 MIN REST | | | | | | | |
| DISCHARGE 14 | 140% | | | | | | |
| 30 MIN REST | | | | | | | |

TESTER S/N
MICRO 400:
MICRO 850:
CELL TRON PLUS:
SBS2002:

DATE:
TECHNICIAN:

*FIG. 2B*

| BATTERY # DEL | CCA 600 | RC | TRC 45 | AH USED 39.16 | | | | | | | SPECIFIC GRAVITIES | | | | | |
|---|---|---|---|---|---|---|---|---|---|---|---|---|---|---|---|---|
| TEST CONDITION | AH REMOVED | MICRO 400 VDC | MICRO 400 CCA | MICRO 800 VDC | MICRO 800 CCA | CELLTRON VDC | CELLTRON KMHOS | CELL 1 | CELL2 | CELL3 | CELL4 | CELL5 | CELL6 |
| INITIAL | | | | | | | | | | | | | |
| CHARGED | 0% | | | | | | | | | | | | |
| DISCHARGE 1 | 10% | 12.94 | 631 | 12.91 | 631 | 12.91 | 1.34 | N/A | | | | | |
| 30 MIN REST | | 12.65 | 6.07 | 12.69 | 822 | 12.69 | 1.29 | N/A | | | | | |
| DISCHARGE 2 | 20% | 12.85 | 598 | 12.86 | 605 | 12.85 | 1.27 | N/A | | | | | |
| 30 MIN REST | | 12.54 | 553 | 12.6 | 574 | 12.6 | 1.2 | N/A | | | | | |
| DISCHARGE 3 | 30% | 12.77 | 547 | 12.77 | 560 | 12.76 | 1.17 | N/A | | | | | |
| 30 MIN REST | | 12.34 | 499 | 12.42 | 512 | 12.4 | 1.06 | N/A | | | | | |
| DISCHARGE 4 | 40% | 12.65 | 488 | 12.64 | 503 | 12.63 | 1.06 | N/A | | | | | |
| 30 MIN REST | | 12.09 | 407 | 12.19 | 428 | 12.23 | .918 | N/A | | | | | |
| DISCHARGE 5 | 50% | 12.51 | 419 | 12.5 | 432 | 12.51 | 0.937 | N/A | | | | | |
| 30 MIN REST | | 11.51 | 29 | 11.63 | 48 | 11.74 | 0.498 | N/A | | | | | |
| DISCHARGE 6 | 60% | 12.25 | 299 | 12.23 | 317 | 12.23 | 0.712 | N/A | | | | | |
| 30 MIN REST | | 11.46 | 8 | 11.61 | 13 | 11.83 | 0.735 | N/A | | | | | |
| DISCHARGE 7 | 70% | 12.2 | 260 | 12.19 | 273 | 12.2 | 0.642 | N/A | | | | | |
| 30 MIN REST | | | | | | | | | | | | | |
| DISCHARGE 8 | 80% | | | | | | | | | | | | |
| 30 MIN REST | | | | | | | | | | | | | |
| DISCHARGE 9 | 90% | | | | | | | | | | | | |
| 30 MIN REST | | | | | | | | | | | | | |
| DISCHARGE 10 | 100% | | | | | | | | | | | | |
| 30 MIN REST | | | | | | | | | | | | | |
| DISCHARGE 11 | 110% | | | | | | | | | | | | |
| 30 MIN REST | | | | | | | | | | | | | |
| DISCHARGE 12 | 120% | | | | | | | | | | | | |
| 30 MIN REST | | | | | | | | | | | | | |
| DISCHARGE 13 | 130% | | | | | | | | | | | | |
| 30 MIN REST | | | | | | | | | | | | | |
| DISCHARGE 14 | 140% | | | | | | | | | | | | |
| 30 MIN REST | | | | | | | | | | | | | |

TESTER S/N
MICRO 400:
MICRO 850:
CELL TRON PLUS:
SBS2002:

DATE:
TECHNICIAN:

FIG. 2C

EXPERIMENT 00

| AMP HOURS REMOVED | NEW mOhms | NEW CCA | OLD mOhms | OLD CCA |
|---:|---:|---:|---:|---:|
| 0% | 3.96 | 790 | 4.95 | 631 |
| 10% | 4.05 | 772 | 5.23 | 598 |
| 20% | 4.16 | 751 | 5.71 | 547 |
| 30% | 4.26 | 733 | 6.40 | 488 |
| 40% | 4.48 | 697 | 7.46 | 419 |
| 50% | 4.74 | 659 | 10.45 | 299 |
| 60% | 4.99 | 626 | 12.02 | 260 |
| 70% | 5.43 | 575 | | |
| 80% | 6.07 | 515 | | |
| 90% | 6.58 | 468 | | |
| 100% | 6.76 | 462 | | |

FIG 2D

EXPERIMENT 01

Procedure:
1) Measure OCV and Resistance (if CCA, convert to Resistance -- use calculator on right)
2) Index into Curve Pair 1 until the Table Voltage is Less Than or Equal to the OCV
3) Compare Measured mOhms to Table mOhms at Index point
4) If Measured mOhms is less than or equal to Table mOhms, State of Health is greater than or equal to 100%
5) If not, choose next Curve Pair and repeat
6) When condition is met, read State of Health from the Curve Pair header
7) If the condition is never met, State of Health is less than the last Curve Pair used Example:

| Measured | |
|---|---|
| Voltage | 12.45 |
| CCA | 500 |
| mOhms | 6.25 |

Curve Pair 1

| State Of | | |
|---|---|---|
| 100% | | |
| Voltage | Index | R (mOhms) |
| 12.75 | 1 | 6.25 |
| 12.70 | 2 | 6.25 |
| 12.65 | 3 | 6.32 |
| 12.60 | 4 | 6.48 |
| 12.55 | 5 | 6.64 |
| 12.50 | 6 | 6.90 |
| 12.45 | 7 | 7.08 |
| 12.40 | 8 | 7.38 |
| 12.35 | 9 | 7.70 |
| 12.30 | 10 | 8.05 |
| 12.25 | 11 | 8.43 |
| 12.20 | 12 | 8.85 |
| 12.15 | 13 | 9.32 |
| 12.10 | 14 | 9.66 |
| 12.05 | 15 | 10.22 |
| 12.00 | 16 | 10.63 |
| 11.95 | 17 | 11.30 |
| 11.90 | 18 | 11.81 |
| 11.85 | 19 | 12.35 |
| 11.80 | 20 | 12.96 |
| 11.75 | 21 | 13.62 |
| 11.70 | 22 | 14.36 |

Curve Pair 2

| State Of | | |
|---|---|---|
| 95% | | |
| Voltage | Index | R (mOhms) |
| 12.75 | 1 | 6.58 |
| 12.70 | 2 | 6.58 |
| 12.65 | 3 | 6.66 |
| 12.60 | 4 | 6.82 |
| 12.55 | 5 | 6.99 |
| 12.50 | 6 | 7.26 |
| 12.45 | 7 | 7.46 |
| 12.40 | 8 | 7.77 |
| 12.35 | 9 | 8.10 |
| 12.30 | 10 | 8.47 |
| 12.25 | 11 | 8.88 |
| 12.20 | 12 | 9.32 |
| 12.15 | 13 | 9.81 |
| 12.10 | 14 | 10.17 |
| 12.05 | 15 | 10.75 |
| 12.00 | 16 | 11.18 |
| 11.95 | 17 | 11.90 |
| 11.90 | 18 | 12.43 |
| 11.85 | 19 | 13.00 |
| 11.80 | 20 | 13.64 |
| 11.75 | 21 | 14.34 |
| 11.70 | 22 | 15.11 |

Curve Pair 3

| State Of | | |
|---|---|---|
| 90% | | |
| Voltage | Index | R (mOhms) |
| 12.75 | 1 | 6.94 |
| 12.70 | 2 | 6.94 |
| 12.65 | 3 | 7.03 |
| 12.60 | 4 | 7.20 |
| 12.55 | 5 | 7.38 |
| 12.50 | 6 | 7.67 |
| 12.45 | 7 | 7.87 |
| 12.40 | 8 | 8.20 |
| 12.35 | 9 | 8.55 |
| 12.30 | 10 | 8.94 |
| 12.25 | 11 | 9.37 |
| 12.20 | 12 | 9.84 |
| 12.15 | 13 | 10.36 |
| 12.10 | 14 | 10.73 |
| 12.05 | 15 | 11.35 |
| 12.00 | 16 | 11.81 |
| 11.95 | 17 | 12.56 |
| 11.90 | 18 | 13.12 |
| 11.85 | 19 | 13.73 |
| 11.80 | 20 | 14.40 |
| 11.75 | 21 | 15.14 |
| 11.70 | 22 | 15.95 |

Curve Pair 4

| State Of | | |
|---|---|---|
| 85% | | |
| Voltage | Index | R (mOhms) |
| 12.75 | 1 | 7.35 |
| 12.70 | 2 | 7.35 |
| 12.65 | 3 | 7.44 |
| 12.60 | 4 | 7.62 |
| 12.55 | 5 | 7.81 |
| 12.50 | 6 | 8.12 |
| 12.45 | 7 | 8.33 |
| 12.40 | 8 | 8.68 |
| 12.35 | 9 | 9.06 |
| 12.30 | 10 | 9.47 |
| 12.25 | 11 | 9.92 |
| 12.20 | 12 | 10.42 |
| 12.15 | 13 | 10.96 |
| 12.10 | 14 | 11.36 |
| 12.05 | 15 | 12.02 |
| 12.00 | 16 | 12.50 |
| 11.95 | 17 | 13.30 |
| 11.90 | 18 | 13.89 |
| 11.85 | 19 | 14.53 |
| 11.80 | 20 | 15.24 |
| 11.75 | 21 | 16.03 |
| 11.70 | 22 | 16.89 |

FIG. 3B

EXPERIMENT 02

Procedure:
1) Measure OCV and Resistance (if CCA, convert to Resistance -- use calculator on right)
2) Index into Curve Pair 1 until the Table Voltage is Less Than or Equal to the OCV
3) Compare Measured mOhms to Table mOhms at Index point
4) If Measured mOhms is less than or equal to Table mOhms, State of Health is greater than or equal to 100%
5) If not, choose next Curve Pair and repeat
6) When condition is met, read State of Health from the Curve Pair header
7) If the condition is never met, State of Health is less than the last Curve Pair used Example:

| Measured | |
|---|---|
| Voltage | 12.45 |
| CCA | 500 |
| mOhms | 6.25 |

Curve Pair 1

| State Of | | |
|---|---|---|
| 100% | | |

| Voltage | Index | R (mOhms) |
|---|---|---|
| 12.75 | 1 | 6.25 |
| 12.70 | 2 | 6.25 |
| 12.65 | 3 | 6.32 |
| 12.60 | 4 | 6.48 |
| 12.55 | 5 | 6.64 |
| 12.50 | 6 | 6.90 |
| 12.45 | 7 | 7.08 |
| 12.40 | 8 | 7.38 |
| 12.35 | 9 | 7.70 |
| 12.30 | 10 | 8.05 |
| 12.25 | 11 | 8.43 |
| 12.20 | 12 | 8.85 |
| 12.15 | 13 | 9.32 |
| 12.10 | 14 | 9.66 |
| 12.05 | 15 | 10.22 |
| 12.00 | 16 | 10.63 |
| 11.95 | 17 | 11.30 |
| 11.90 | 18 | 11.81 |
| 11.85 | 19 | 12.35 |
| 11.80 | 20 | 12.96 |
| 11.75 | 21 | 13.62 |
| 11.70 | 22 | 14.36 |

Curve Pair 2

| State Of | | |
|---|---|---|
| 95% | | |

| Voltage | Index | R (mOhms) |
|---|---|---|
| 12.75 | 1 | 6.58 |
| 12.70 | 2 | 6.58 |
| 12.65 | 3 | 6.66 |
| 12.55 | 4 | 6.99 |
| 12.50 | 5 | 7.26 |
| 12.45 | 6 | 7.46 |
| 12.35 | 7 | 8.10 |
| 12.30 | 8 | 8.47 |
| 12.25 | 9 | 8.88 |
| 12.15 | 10 | 9.81 |
| 12.10 | 11 | 10.17 |
| 12.05 | 12 | 10.75 |
| 11.95 | 13 | 11.90 |
| 11.90 | 14 | 12.43 |
| 11.85 | 15 | 13.00 |
| 11.75 | 16 | 14.34 |
| 11.70 | 17 | 15.11 |

Curve Pair 3

| State Of | | |
|---|---|---|
| 90% | | |

| Voltage | Index | R (mOhms) |
|---|---|---|
| 12.75 | 1 | 6.94 |
| 12.70 | 2 | 6.94 |
| 12.60 | 3 | 7.20 |
| 12.55 | 4 | 7.38 |
| 12.45 | 5 | 7.87 |
| 12.40 | 6 | 8.20 |
| 12.30 | 7 | 8.94 |
| 12.25 | 8 | 9.37 |
| 12.15 | 9 | 10.36 |
| 12.10 | 10 | 10.73 |
| 12.00 | 11 | 11.81 |
| 11.95 | 12 | 12.56 |
| 11.85 | 13 | 13.73 |
| 11.80 | 14 | 14.40 |
| 11.70 | 15 | 15.95 |

Curve Pair 4

| State Of | | |
|---|---|---|
| 85% | | |

| Voltage | Index | R (mOhms) |
|---|---|---|
| 12.75 | 1 | 7.35 |
| 12.65 | 2 | 7.44 |
| 12.55 | 3 | 7.81 |
| 12.45 | 4 | 8.33 |
| 12.35 | 5 | 9.06 |
| 12.25 | 6 | 9.92 |
| 12.15 | 7 | 10.96 |
| 12.05 | 8 | 12.02 |
| 11.95 | 9 | 13.30 |
| 11.85 | 10 | 14.53 |
| 11.75 | 11 | 16.03 |

FIG. 4B

APPARATUS AND METHOD FOR TESTING RECHARGEABLE ENERGY STORAGE BATTERIES

CROSS-REFERENCE TO RELATED APPLICATIONS

This application makes reference to, and claims priority to, United States provisional application Ser. No. 60/139,439 filed June 16, 1999.

INCORPORATION BY REFERENCE

The above-referenced United States provisional application Ser. No. 60/139,439 is hereby incorporated by reference in its entirety.

STATEMENT REGARDING FEDERALLY SPONSORED RESEARCH OR DEVELOPMENT

N/A

BACKGROUND OF THE INVENTION

In European patent application 80101949.8, Robert Bosch GmbH specifies an apparatus and method for testing of rechargeable batteries in varying states of charge. The Bosch reference, however, discloses a method having inherent limitations that would result in a battery tester having several disadvantages and problems. These disadvantages and problems will become apparent to one of skill in the art through comparison of the Bosch reference with the present invention as set forth in the remainder of the present application with reference to the drawings.

BRIEF SUMMARY OF THE INVENTION

Various aspects of the present invention can be found in a rechargeable energy storage battery testing system that measures the open circuit voltage and a dynamic parameter of a test battery, scales the measured dynamic parameter, and determines the physical condition of the test battery using the open circuit voltage, the scaled dynamic parameter and correlation data. The system then displays to a test operator the physical condition of the test battery.

The correlation data used to calculate the physical condition may be stored in system memory, and is based on the dynamic parameter of another standard battery (or batteries) at one or more charge states. The scaling of the dynamic parameter is based on the same dynamic parameter of a standard battery that corresponds to the test battery, and may be carried out by multiplying the measured dynamic parameter of the test battery by the ratio of the ratings of the test battery and a battery upon which the correlation data is based. The dynamic parameter used may be, for example, the internal alternating current resistance, or, alternatively, conductance, impedance or admittance.

In one embodiment of the invention, the system applies a high current load pulse to the test battery, and then waits a predetermined rest period before measuring the open circuit voltage.

In another embodiment, the correlation data is based on a single charge state, and the system determines whether the physical condition of the test battery falls below the correlation data. If it does, the system indicates that the test battery has failed, which indication may be carried out by displaying an "F" or "Fail" condition. Otherwise, the system indicates that the battery has passed, which again may be carried out by displaying a "P" or "Pass" condition.

In a further embodiment of the invention, the system also (or alternatively) determines the charge state of the test battery, and displays the charge state to a test operator. The charge state may be determined from a calculated state of charge value for the test battery. For example, the system may analyze the calculated state of charge value and determine within which of several value ranges the calculated state of charge value falls. Since each of the value ranges represents a different charge state, the range determined also determines the charge state of the test battery.

The state of charge value may be determined using the measured open circuit voltage and the correlation data. For example, in one embodiment, the correlation data represents an open circuit voltage versus amp hour removed curve. The measured open circuit voltage is compared to the open circuit voltage represented by the correlation data, and the number of data points compared is counted until the measured open circuit voltage becomes greater than or equal to the open circuit voltage represented by the correlation data. The number of points compared is then divided by the total number of points in the curve, and the result represents the relative distance along the curve. The result is then subtracted from one to obtain the state of charge value.

Other aspects, advantages and novel features of the present invention will become apparent from the following detailed description of the invention when considered in conjunction with the accompanying drawings.

BRIEF DESCRIPTION OF THE SEVERAL VIEWS OF THE DRAWING

FIGS. 1B and 1C illustrate a detailed bill of material for the testing system of FIG. 1A.

FIGS. 2A through 2D illustrates one embodiment of data generated from like batteries of varying physical condition that can be used to generate correlation data.

FIG. 3B is a table listing the data from the curves of FIG. 3A.

FIG. 4B is a table listing the data from the curves of FIG. 4A.

DETAILED DESCRIPTION OF THE INVENTION

Figures 1, 1A:
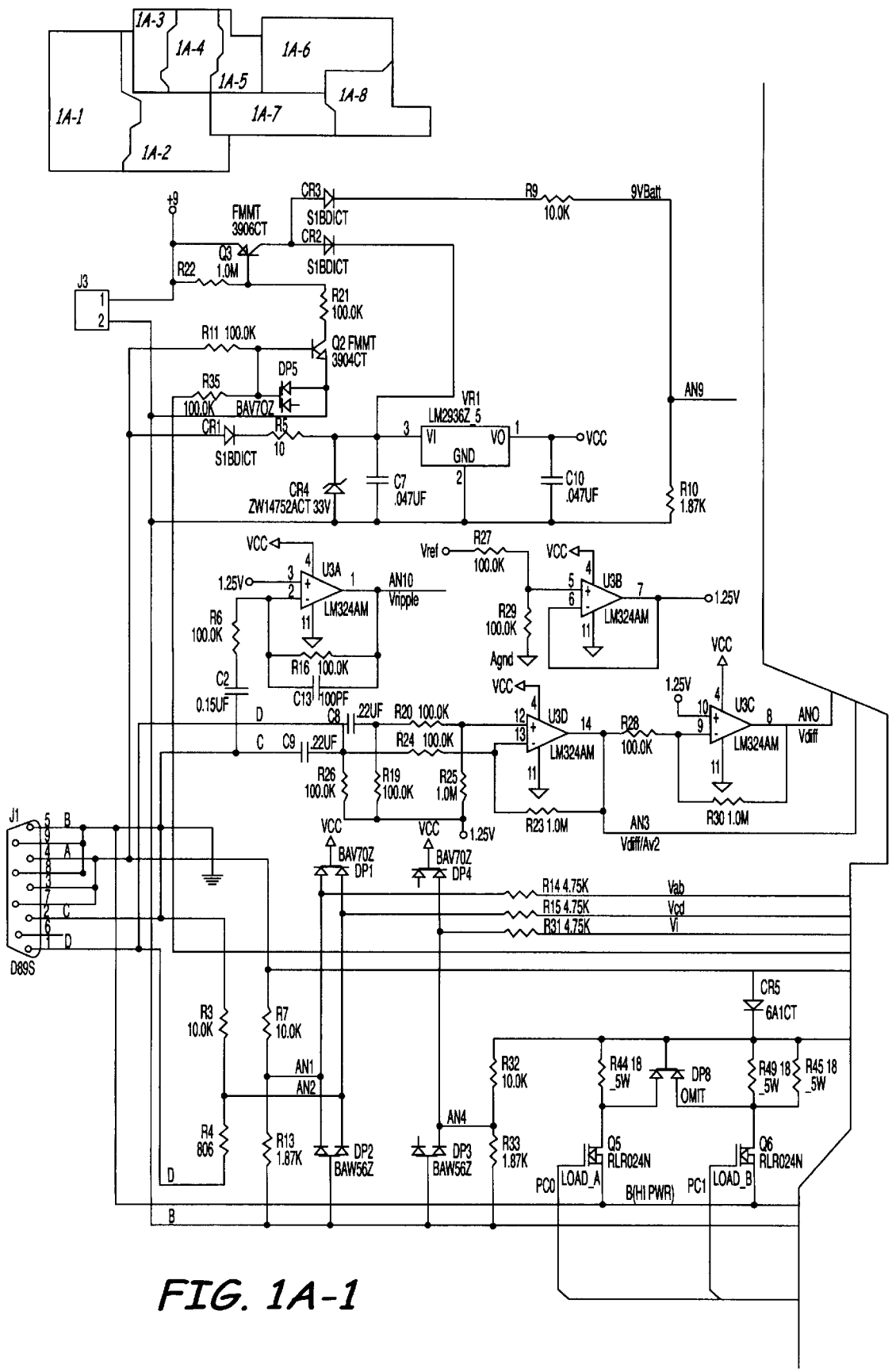
FIG. 1A illustrates one embodiment of a battery testing system for implementing the method of the present invention.

FIG. 1A illustrates one embodiment of a battery testing system 101 for implementing the method of the present invention. The system 101 includes a microprocessor 103. The microprocessor 103 may be a Motorola MC68HC705C9ACFN that uses the standard Motorola HC05 core. Of course other microprocessors, or hardware circuitry, may instead be used in accordance with the present invention.

FIGS. 1B and 1C represent a detailed bill of material for the testing system 101 of FIG. 1A. FIGS. 1B and 1C list, among other things, exemplary components and component values that may be used in the testing system 101 illustrated in FIG. 1A.

The testing system 101 of FIG. 1A may employ a method that utilizes correlation data formulated from like batteries in varying physical condition. The correlation is first generated, and then data stored in testing system memory and used as a basis for testing of other batteries. To generate such correlation data, a battery or set of batteries is first tested, and the limited data collected is then synthesized with available, standard data to generate a set of curves against which other like batteries are tested.

Specifically, FIGS. 2A through 2D represent one embodiment of data generated from like batteries of varying physical condition that can be used to generate correlation data. To generate the data in FIGS. 2A through 2D, two Delco batteries of identical manufacture and design, but with different physical conditions were tested. The first battery was new, and reserve capacity tests revealed that it had a reserve capacity of approximately 94 minutes. The second battery was used, and reserve capacity tests on that battery revealed that it had a reserve capacity of approximately 45 minutes, or roughly one-half that of the first, new battery. Data relating to open circuit voltage (Ub) and dynamic resistance (Rs) were then gathered from both batteries, and are plotted in FIG. 2A against amp hours removed. The gathered data is listed in the tables shown in FIGS. 2B, 2C and 2D.

Figure 3A:
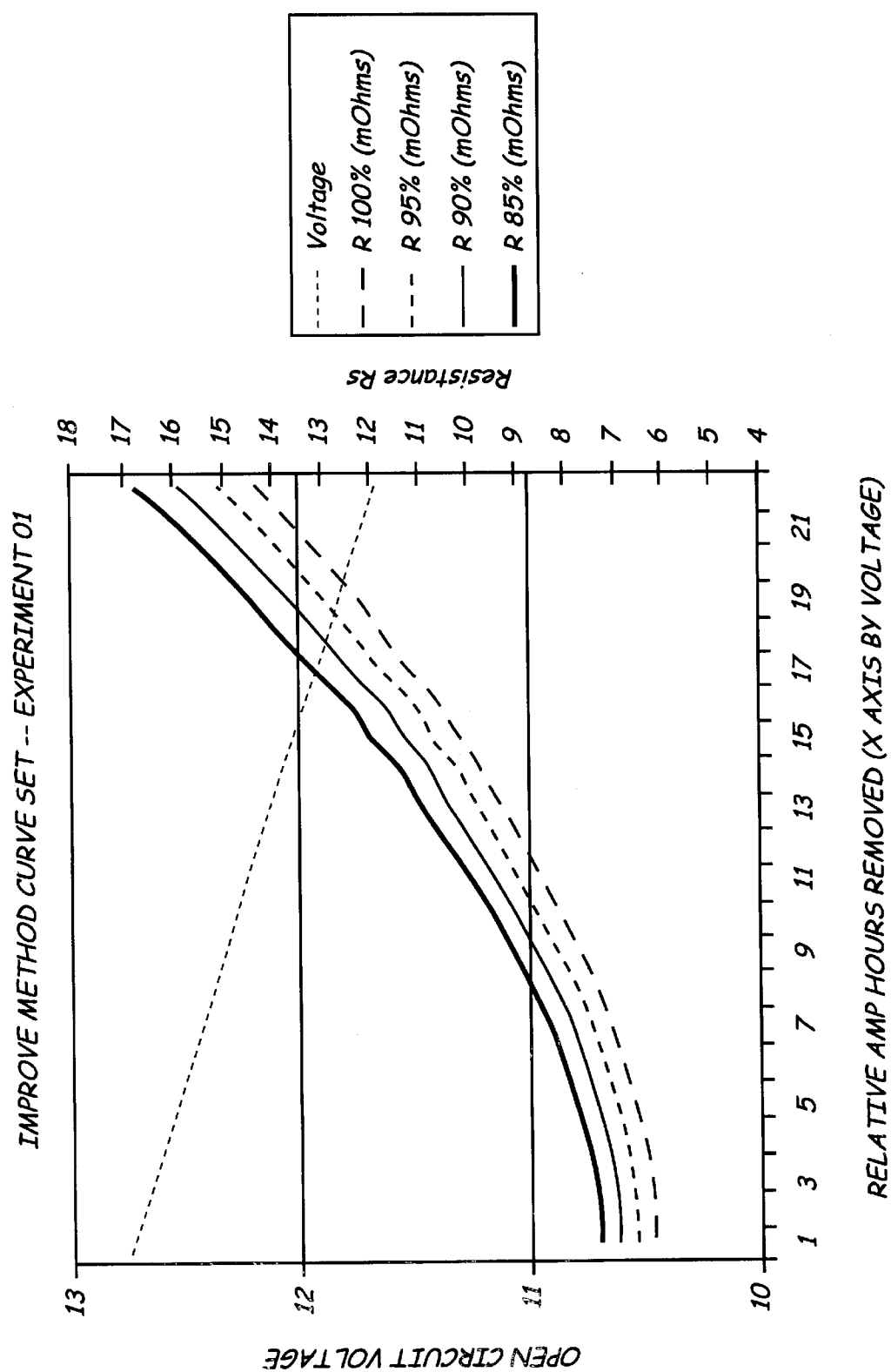
FIG. 3A illustrates four individual curves relating to, respectively, four physical conditions of 100%, 95%, 90% and 85%, that were synthesized from standard discharge data.

Due to the difficulty in obtaining a large quantity of batteries of the same design and manufacture in various physical conditions, a set of curves was then synthesized based on observations made regarding the data found in FIGS. 2A–2D, and using available composite battery data. FIG. 3A illustrates four individual curves relating to, respectively, four physical conditions of 100%, 95%, 90% and 85%, that were synthesized from standard discharge data. The curves of FIG. 3A are plotted against amp hours removed, but with the x-axis scale linear with respect to voltage rather than with respect to amp hours removed (as can be seen by the straight line voltage curve). The synthesized data used for the curves of FIG. 3A, as well as additional detail regarding the generation of the data, are shown in FIG. 3B.

Figures 1, 1A, 2, 3:
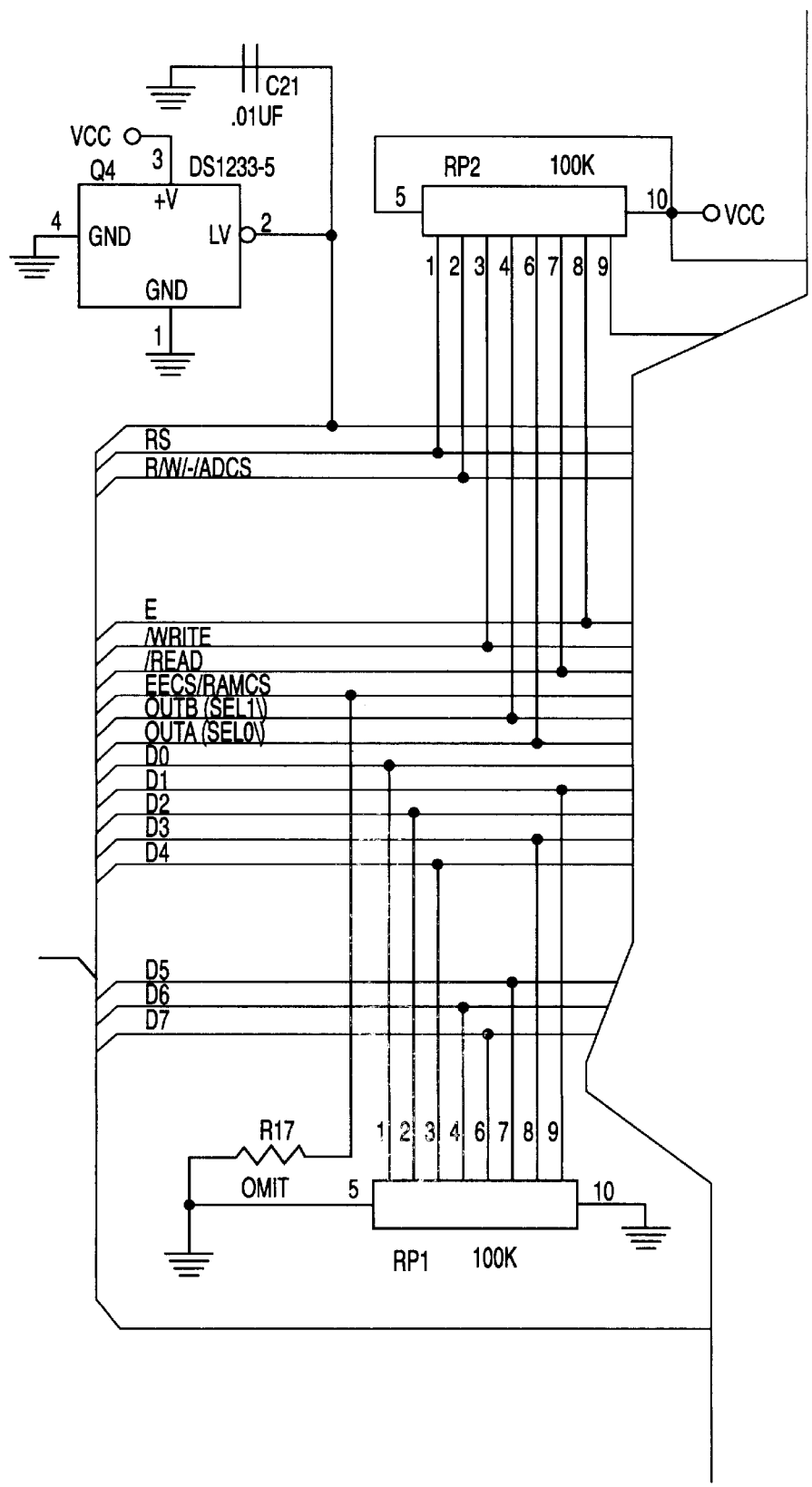
Figures 1, 1A, 2, 3, 4:
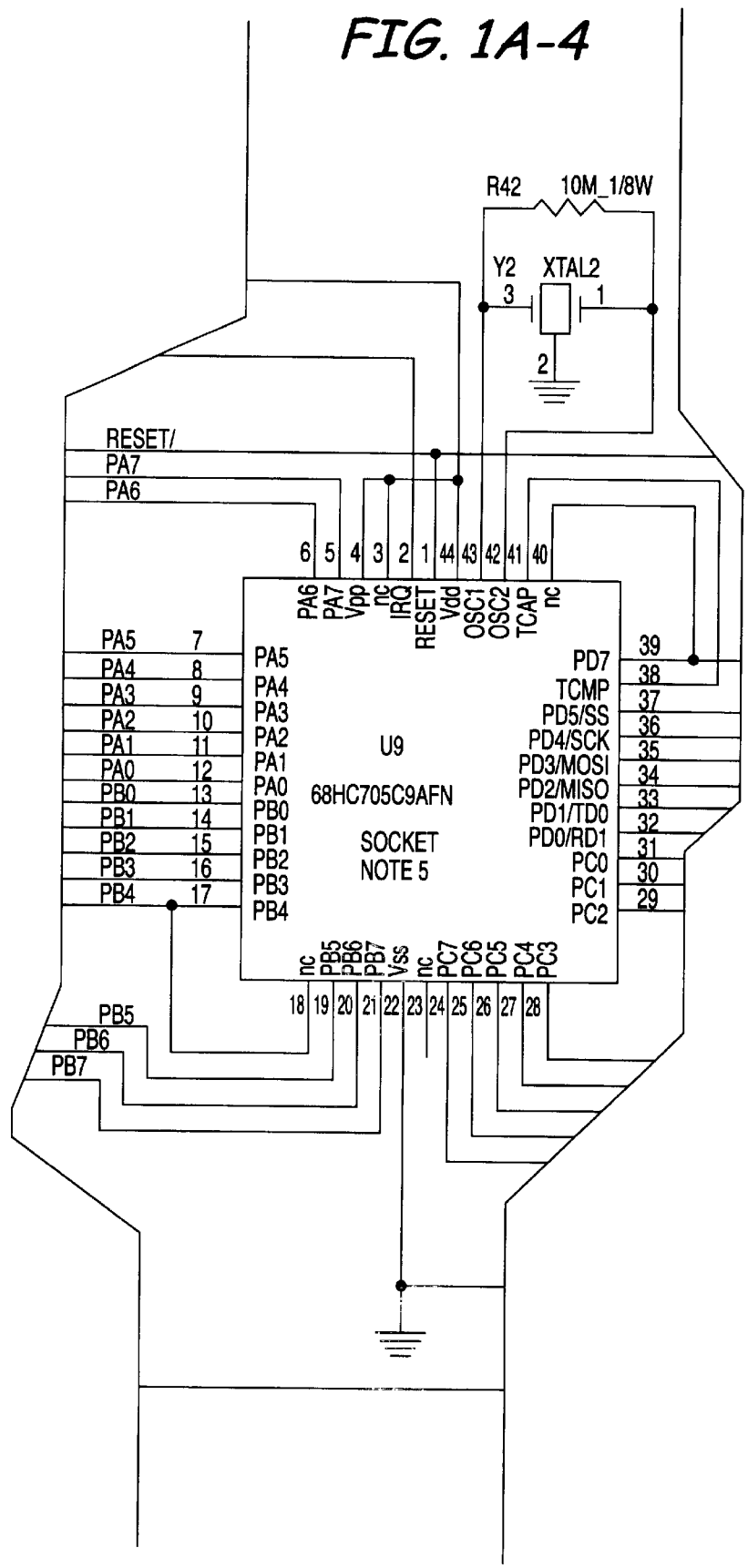
Figure 4A:
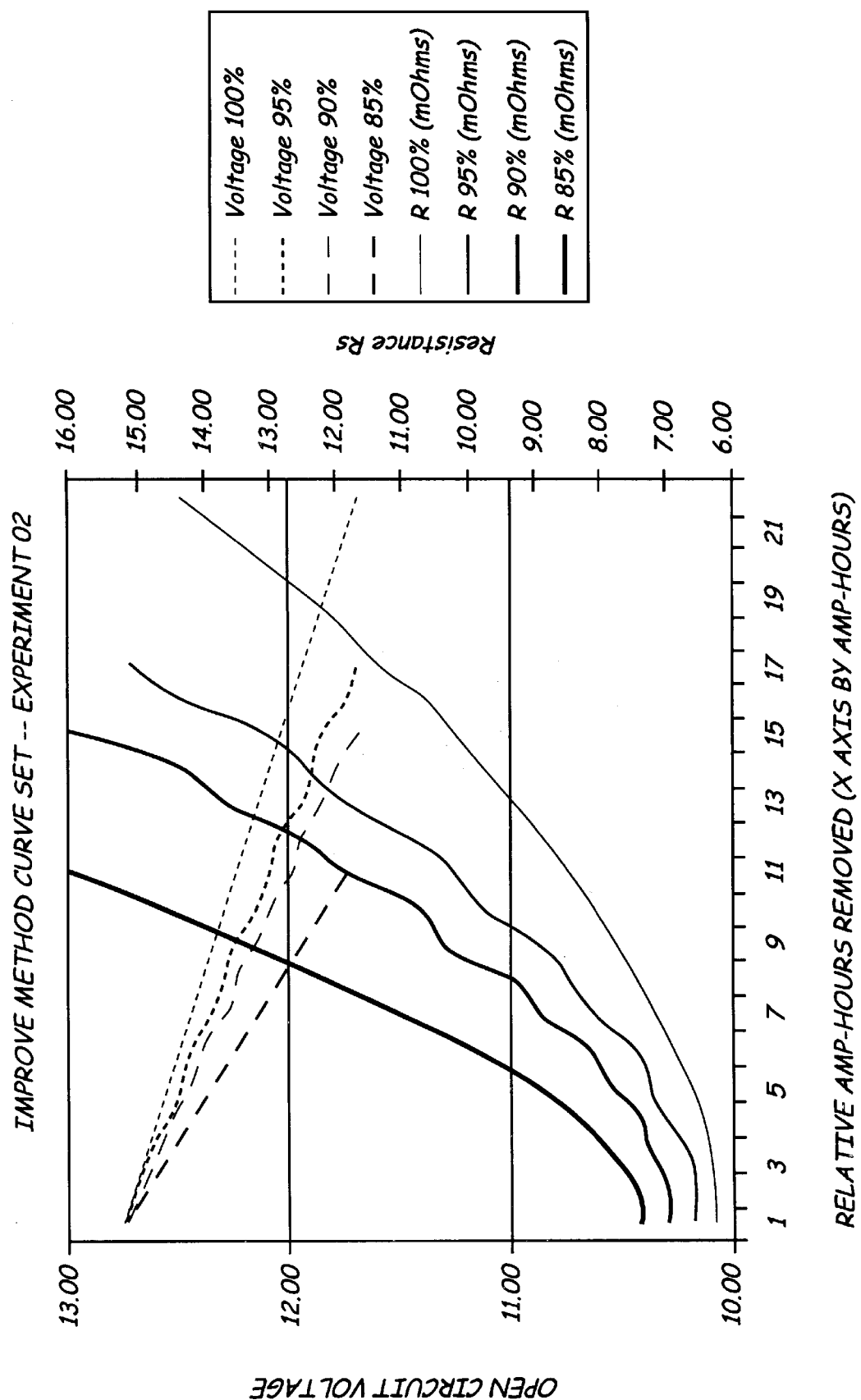
FIG. 4A illustrates four new distinct curves that are the curves of FIG. 3A linearized to amp hours removed, rather than voltage.
Figure 5:
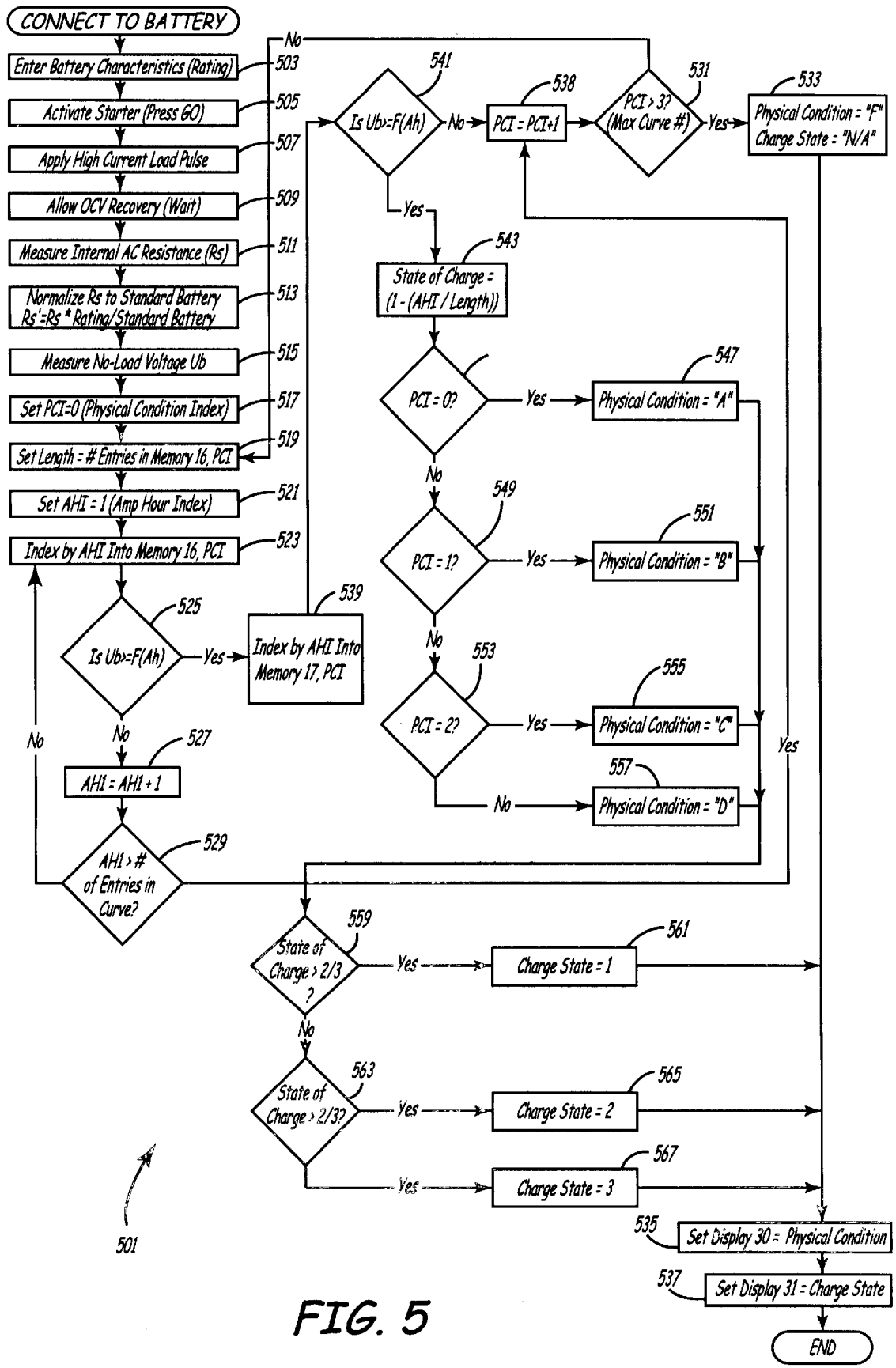

Next, the curves of FIG. 3A were specified as a function of amp hours removed, in which case the x-axis was made linear with respect to amp hours removed. FIG. 4A represents four distinct curves that are the curves of FIG. 3A linearized to amp hours removed, rather than voltage. The data used for the curves of FIG. 4A, as well as additional detail regarding the generation of the data, are shown in FIG. 4B. The data shown in FIGS. 4A and 4B was then stored in memory in the testing system 101 of FIG. 1, and is the correlation data used in the method of FIG. 2. Of course, other procedures may be employed to tabulate or generate data for use by the battery testing system and method of the present invention.

Figures 1, 1A, 2, 3, 4, 5:
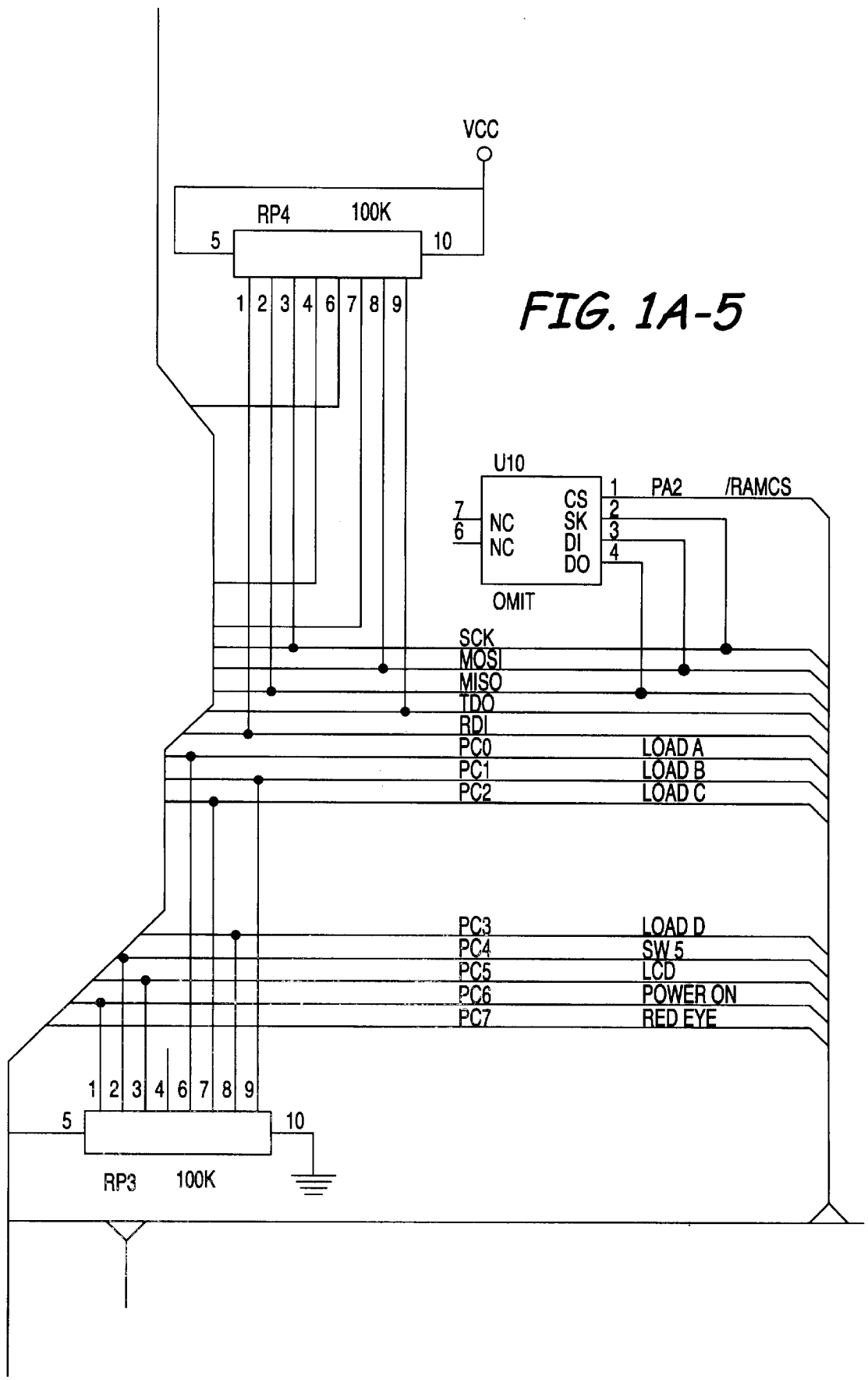
FIG. 5 illustrates a flow chart for one software implementation of the method of the present invention.
Figures 1, 1A, 2, 3, 4, 5, 6:
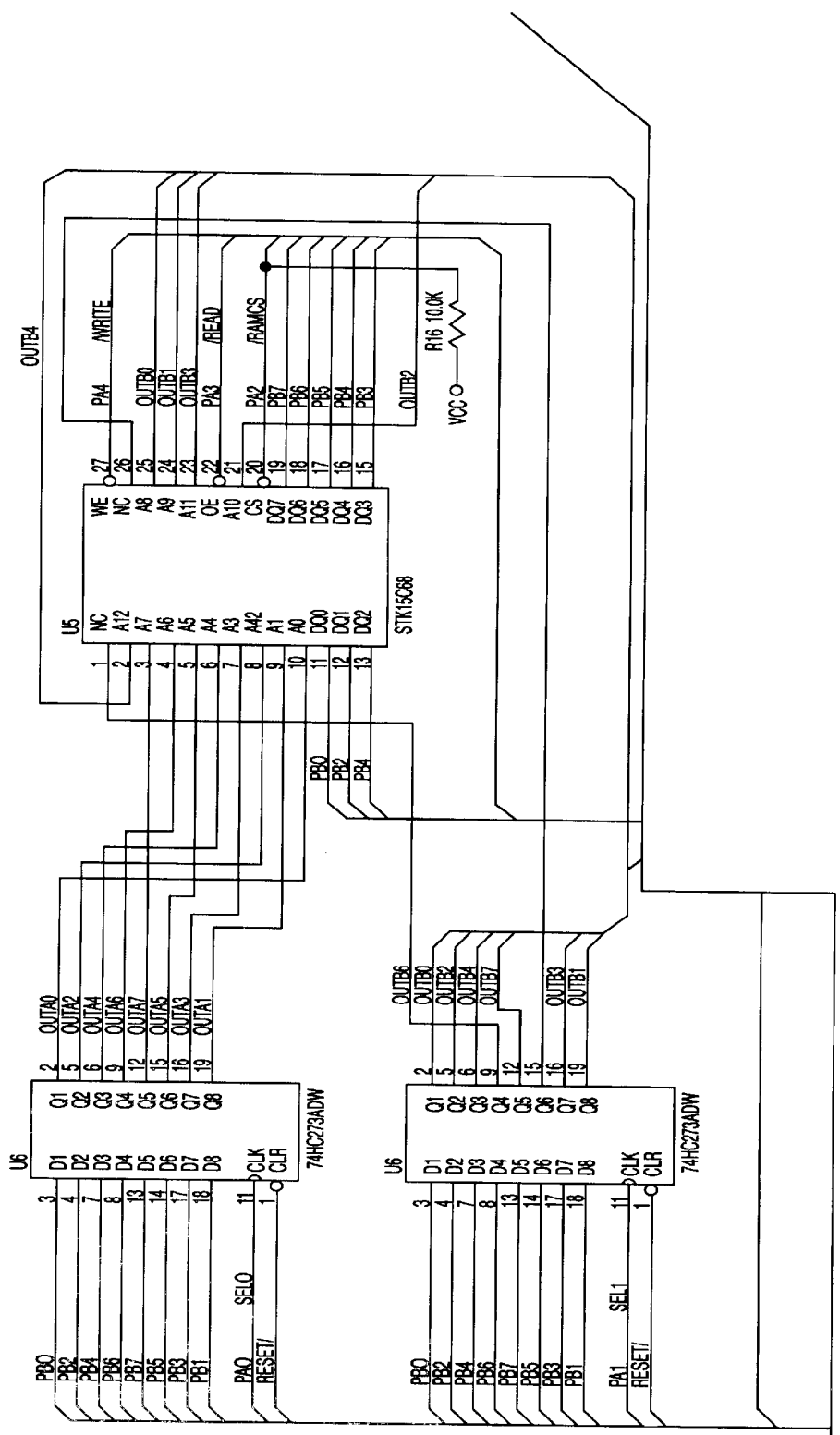
Figures 1, 1A, 2, 3, 4, 5, 6, 7:
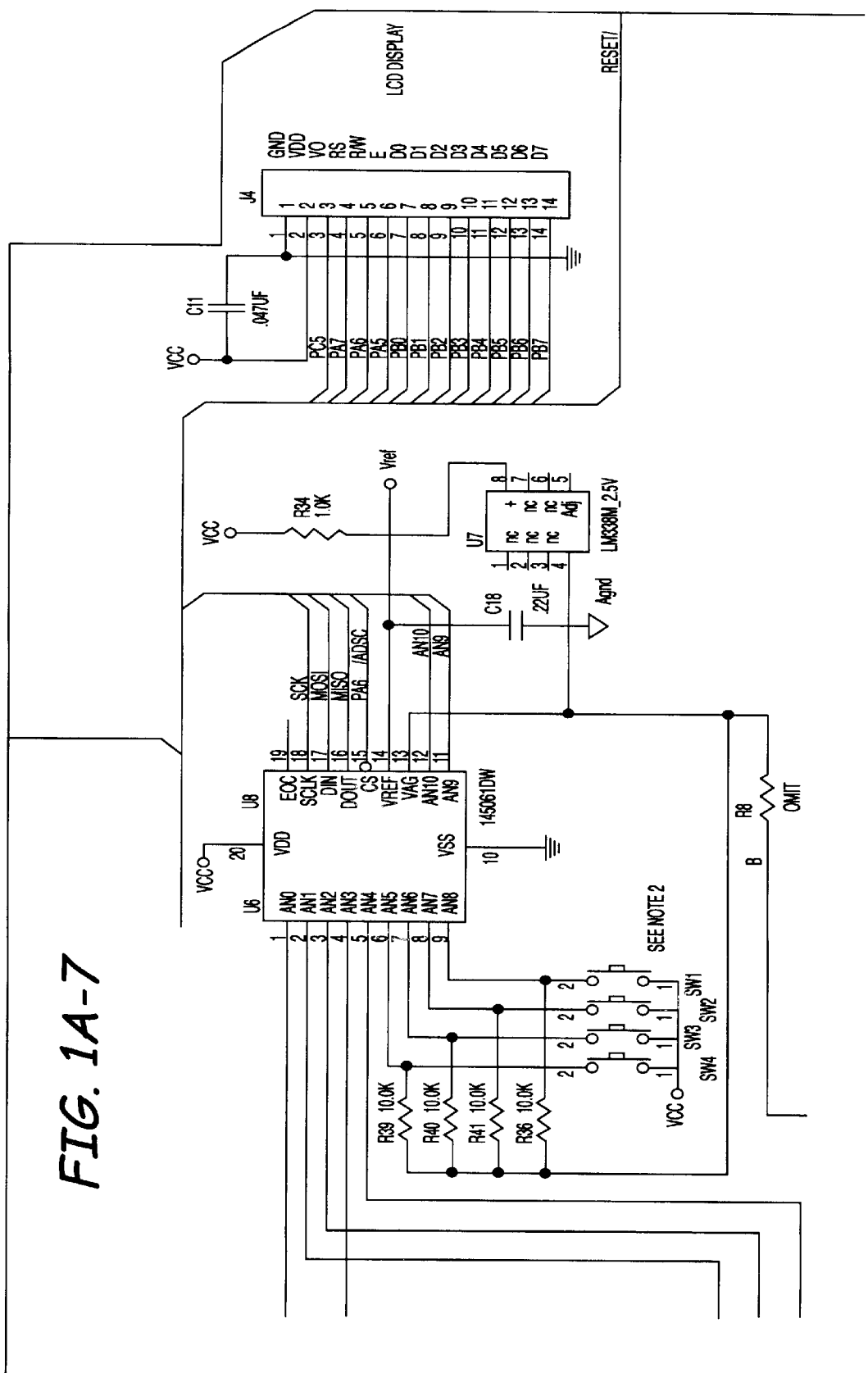
Figures 1, 1A, 2, 3, 4, 5, 6, 7, 8:
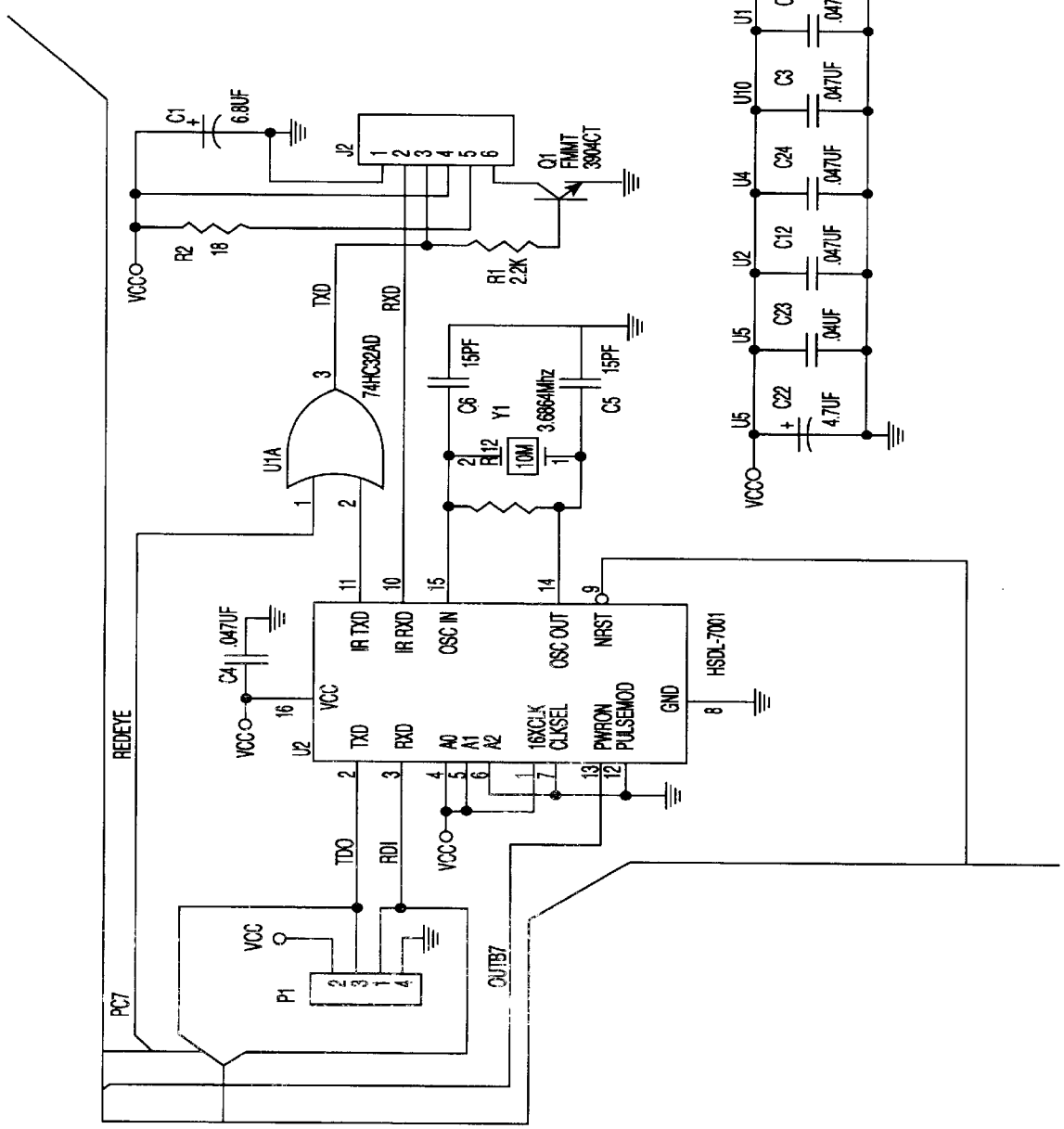
Figure 2A:
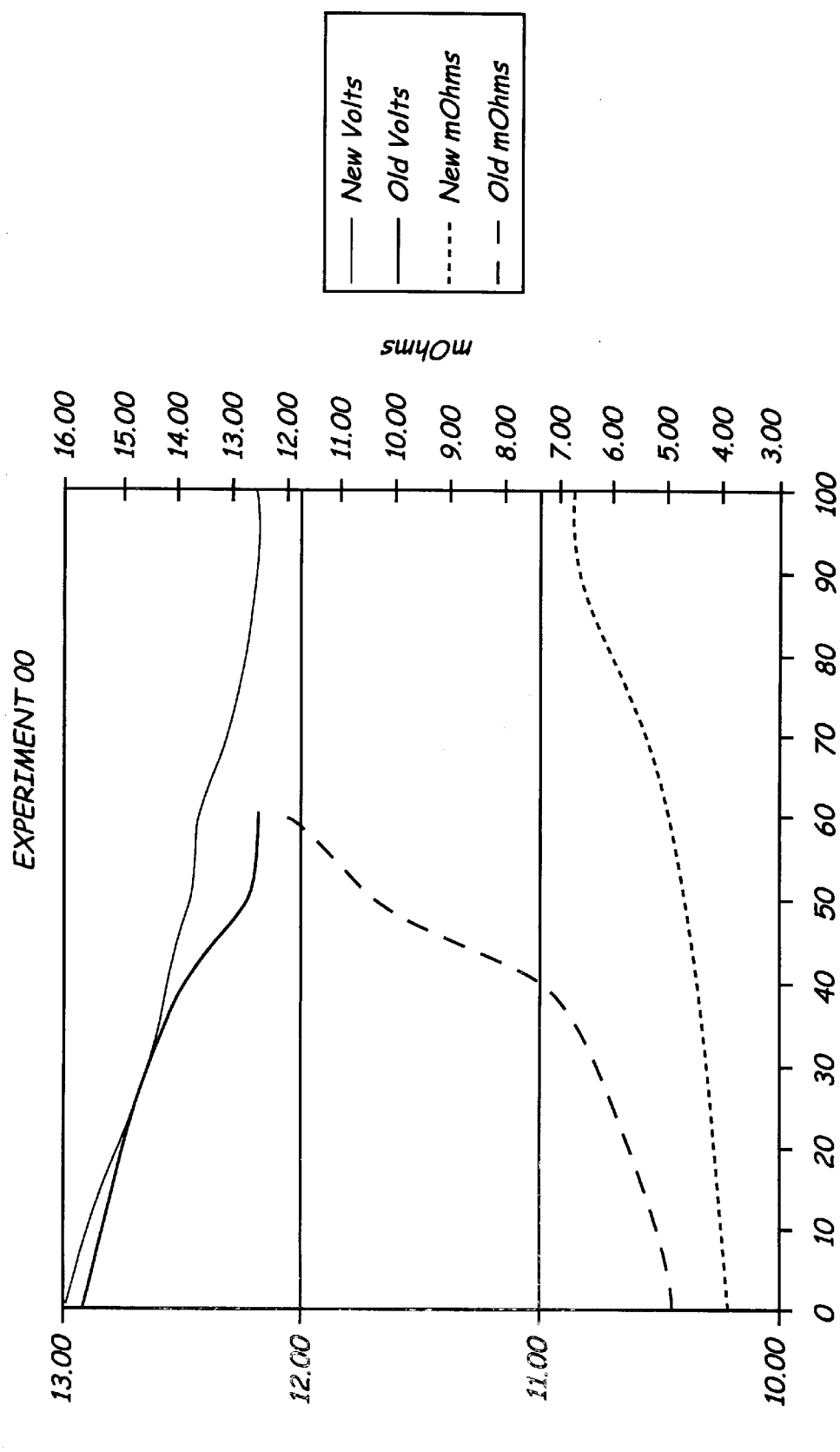

FIG. 5 represents a flow chart 501 for one software implementation of the method of the present invention. Each flowchart block in FIG. 5 is given a designation, such as, for example, S02, S04, etc. referring to STATE02, STATE04, etc., for direct reference to the assembly language software listing that was included as part of provisional patent application Ser. No. 60/139,439, which application, including the software listing, is incorporated herein by reference in its entirety. The incorporated software listing represents an exemplary assembly language program that may be used by the microprocessor 103 of FIG. 1. The incorporated software listing is written entirely in HC05 assembly language, and, for ease of review, the use of interrupts and hardware timers was eliminated. Of course, other software programs may also be used to implement the method of the present invention.

Referring again to FIG. 5, the tester system is initialized by operatively connecting the tester system to a battery to be tested (i.e., a test battery). Once the test battery is connected, an operator enters, via a data entry component of the system, a battery characteristic or battery rating, such as the cold crank amps (CCA) rating, of the test battery (block 503). The testing procedure is then manually started by the test operator by pressing a start or "Go" button, for example (block 505). The procedure may also be automatically started after entry of the test battery rating.

The tester system then applies a high current load pulse to the test battery (block 507). The high current load pulse is applied to eliminate measurement errors caused by surface charge of freshly charged test batteries or defective cell connectors. Application of the high current pulse, however, may have the undesired effect of inducing the opposite problem, i.e., negative polarization. The system therefore waits a predetermined rest period to allow open circuit voltage recovery, that is, to allow any slight negative polarization to decay (block 509). The predetermined rest period may be, for example, on the order of approximately 5 seconds. This recovery or rest period ensures a more accurate measurement.

The system next measures a dynamic parameter of the test battery. In the embodiment of FIG. 2, the internal alternating current (dynamic) resistance (Rs) is measured (block 211). Other dynamic parameters, such as, for example, conductance, impedance and admittance may also be used. The dynamic parameter may be measured by using a constant current source to generate a periodic signal that is used to excite the battery.

Alternatively, a fixed resistance load coupled through an electronic switch (such as a bipolar transistor or FET) may be used to measure the voltage drop across the resistor, which in turn is used to calculate the actual AC current drawn from the test battery. Unlike the constant current source, this measurement is dependent on battery voltage, and can therefore be used to determine the dynamic resistance using the following equation:

$$Rs=E/I$$

where I is the actual calculated AC current drawn from the test battery and E is the AC voltage drop across the test battery. This measurement technique is a low cost alternative to the constant current source. In either case, Kelvin connections provide an accurate, low cost, means for the system to read dynamic resistance in the range of interest (i.e., approximately 10mΩ). In addition, in order to ensure accurate measurement of Rs, a determination that a low ohmic connection between the system and the test battery has been achieved may be made, and an indication as such displayed to the test operation.

The system may next scale or normalize measured dynamic resistance to that of a standard battery to achieve a scaled dynamic resistance (Rs) (block 213). This may be achieved using the following equation:

$$Rs'=Rs*\text{Rating/Standard Battery}$$

where "Rs" is the measured dynamic resistance, "rating" is the rating for the test battery, and "standard battery" is the rating of the standard battery, i.e., that used to generate the correlation data. To obtain the test battery rating information, the system may prompt the test operator to enter such information via a data entry component of the system prior to the testing procedure (or prior to measurement of Rs).

Scaling as such using readily available battery rating information may be employed to fit the test battery into the existing curve set (i.e., correlation data) stored in memory. Scaling enables a single battery or small set of batteries to be used to generate the correlation data, eliminating the need for generating such data for every rated battery. Scaling also minimizes the amount of data that must be stored and analyzed by the system of the present invention. Of course, other types of scaling may also be used and are contemplated by the present invention.

Once the scaling is complete, the system measures the no-load (open circuit) voltage, i.e., the direct current voltage of the battery without a load in place (Ub) (block 515). This measured open circuit voltage is used for later calculations.

Next, the system initializes several variables. First, the system sets a Physical Condition Index (PCI) variable equal to zero (block 517). As explained more completely below, the value of this index after the calculations are complete represents a physical condition of the test battery. Second, "Length" is set to the number of correlation data entries stored in the memory that corresponds to the first voltage curve in FIG. 4A (block 519). And third, the Amp Hour Index (AHI) variable is set to 1 (block 521). Also as explained more completely below, this index is likewise used in later calculations to determine the physical condition and a state of charge of the test battery. The AHI value is then used to access the memory that corresponds to the first voltage curve in FIG. 4A (block 521).

Once these variables are initialized, the system compares the measured open circuit voltage of the test battery to the open circuit voltage represented by the first curve stored in memory (block 525). Specifically, the system determines whether the measured open circuit voltage is greater than or equal to the voltage value represented by the first point in memory (i.e., the first point along the curve) (block 525). If the measured open circuit voltage is not greater than or equal to the voltage represented by the first point, the system increments AHI (block 527) and determines whether all points along the curve have been considered (block 529). If not, the system loops back to block 523, the new AHI value is used to access the memory associated with the voltage curve (block 523), and the measured open circuit voltage is compared to the second voltage value represented by the second point in memory (i.e., the second point along the curve) (block 525). Again, if the measured open circuit voltage is not greater than the voltage represented by the second point, the system increments AHI (block 527) and determines whether all points along the curve have been considered. This process is repeated until the system finds a point along the curve at which the measured open circuit voltage is greater than or equal to the voltage represented by that point, or until all points on the curve are considered.

If all points on the curve have been considered, the system then increments the PCI counter (block 530), and checks to see if all curves have been considered (block 531). If not, the process is started over at block 519 for the next curve. If, however, all curves have been considered at block 531, and the measured open circuit voltage is always less than the voltage values for each curve (block 525), the battery is given a physical condition rating of "F" or Fail and a charge state of "N/A" (block 533). These results are then displayed to the test operator (blocks 535 and 537).

If, however, at block 525, the system determines a point where the measured open circuit voltage is in fact greater than the correlation voltage point being considered, the system accesses a corresponding point in the memory that stored the correlation Rs values (block 539). The scaled, measured Rs' value of the test battery is then compared to the correlation Rs value accessed. Specifically, the system determines whether Rs' is less than or equal to the correlation Rs point accessed from memory (block 541). If it is not, the system increments the PCI counter (block 530) and then determines whether all curves have been considered (block 531). Again, if not, the system loops to block 519 to analyze the next curve. If so, the test battery is given a Physical Condition rating of Fail (block 533).

If the system does in fact find a point along a curve at which the measured open circuit voltage is greater than or equal to the associated correlated voltage (block 525), and at which the Rs' value of the test battery is less than or equal to the corresponding correlation Rs value (block 541), the state of charge of the test battery is then calculated (block 543). The state of charge may be calculated by the following equation:

$$1 = (AHI/\text{Length})$$

where AHI is the index or point along the voltage curve that the conditions in blocks 529 and 541 have been met, and Length is the total length of that curve. AHI divided by Length therefore represents the relative distance that was traveled along the curve to satisfy those conditions. The above equation may be used because the slope of both the voltage and resistance curves become less flat with decreasing state of charge, causing an inherent limitation in memory table length. Also, the table length becomes shorter with decreasing physical condition.

Once the state of charge is calculated, the system performs a physical condition analysis. Specifically, the system determines the current PCI value, which, in turn determines the physical condition of the test battery. If the PCI value is 0 (block 545), meaning that the conditions of block 525 and 541 were satisfied with the first curve, the test battery is given a physical condition rating of "A" (block 547). If instead the PCI value is 1 (block 549), meaning that the conditions of blocks 525 and 541 were satisfied with the second curve, the test battery is given a physical condition rating of "B" (block 551). Similarly, if the PCI value is 2 (block 553), meaning that the conditions of blocks 525 and 541 were satisfied with the third curve, the test battery is given a physical condition rating of "C" (block 555). Otherwise, the test battery is given a condition rating of "D" (block 557). Of course, other rating scales and designations may be used and are contemplated by the present invention.

The state of charge calculated in block 543 is next used to determine the charge state of the test battery. More particularly, if the calculated value is determined to be greater than two-thirds (block 559), for example, the test battery is given a charge state of 1 (block 561), representing a full charge. If the calculated value is instead greater than one-third (block 563), for example, and less than two-thirds (block 559), the test battery is given a charge state of 2 (block 565), representing a partial charge. Otherwise, the test battery is given a charge state of 3 (block 567), representing a discharged state. Ranges as such, rather than specific values, are used because of the inherent inaccuracy that occurs when determining charge state without knowing the homogenous specific gravity of the individual cell electrobyte being measured. This inaccuracy results from variations in battery product design, as well as from expected statistical variation. Roughly categorizing the charge states in groups provides the necessary information to the test operator, without overstating the accuracy of the results. Of course, other charge state ranges and rating scales and designations may be used and are contemplated by the present invention.

Once the physical condition and charge state of the battery is determined, they are displayed to the test operator (blocks 535 and 537).

Many modifications and variations of the present invention are possible in light of the above teachings. Thus, it is to be understood that, within the scope of the appended claims, the invention may be practiced otherwise than as described hereinabove.

What is claimed and desired to be secured by letters patent is:

1. A method of testing a rechargeable energy storage battery comprising:

measuring an open circuit voltage of a test battery having an unknown physical condition;

measuring a dynamic parameter of the test battery;

scaling the dynamic parameter measured based on the dynamic parameter of a standard battery corresponding to the test battery; and determining the physical condition of the test battery using the measured open circuit voltage, the scaled dynamic parameter, and correlation data based on the dynamic parameter of at least one battery at at least one charge state.

2. The method of claim 1 wherein the scaling comprises multiplying the measured dynamic parameter by the ratio of the rating of the test battery to the rating of the standard battery.

3. The method of claim 2 wherein the dynamic parameter is the internal alternating current resistance.

4. The method of claim 1 further comprising displaying an indication of the physical condition of the test battery.

5. The method of claim 1 further comprising:

applying a high current load pulse to the test battery; and after the applying, waiting a predetermined rest period before measuring the open circuit voltage of the test battery.

6. The method of claim 1 wherein the at least one charge state comprises a single charge state, and further comprising indicating a failure condition if the physical condition determined falls below the correlation data of the at least one battery.

7. The method of claim 1 further comprising determining a charge state of the test battery.

8. The method of claim 7 wherein determining the charge state of the test battery comprises calculating a state of charge value and categorizing the state of charge value into one of a plurality of value ranges, each of the plurality of value ranges representing a different charge state.

9. The method claim 7 wherein determining the charge state of the test battery is based on calculating a state of charge of the test battery.

10. The method of claim 9 wherein at least a portion of the correlation data is representative of at least one open circuit voltage versus amp hour removed curve, and wherein calculating a state of charge value comprises:

determining the relative distance along the curve that the measured open circuit voltage becomes greater than or equal to the correlated open circuit voltage; and subtracting the relative distance determined from one.

11. The method of claim 10 wherein determining the relative distance along the curve comprises dividing the number of points along the curve at which the measured open circuit voltage is not greater than or equal to the correlated open circuit voltage by the total number of points along the curve.

12. A method of testing a rechargeable energy storage battery comprising:

measuring an open circuit voltage of a test battery;

measuring a dynamic parameter of the test battery;

scaling the dynamic parameter measured based on the dynamic parameter of a standard battery corresponding to the test battery; and determining a charge state of the test battery using the measured open circuit voltage, the scaled dynamic parameter, and correlation data based on the dynamic parameter of at least one battery at at least one charge state.

13. The method of claim 12 wherein the scaling comprises multiplying the measured dynamic parameter by the ratio of the rating of the test battery to the rating of the standard battery.

14. The method of claim 13 wherein the dynamic parameter is the internal alternating current resistance.

15. The method of claim 12 further comprising:

applying a high current load pulse to the test battery; and after the applying, waiting a predetermined rest period before measuring the open circuit voltage of the test battery.

16. The method of claim 12 wherein determining the charge state of the test battery comprises calculating a state of charge value, and categorizing the state of charge value into one of a plurality of value ranges, each of the plurality of value ranges representing a different charge state.

17. The method of claim 12 wherein determining the charge state is based on calculating a state of charge of the test battery.

18. The method of claim 17 wherein at least a portion of the correlation data is representative of at least one open circuit voltage versus amp hour removed curve, and wherein calculating a state of charge value comprises:

determining the relative distance along the curve that the measured open circuit voltage becomes greater than or equal to the correlated open circuit voltage; and subtracting the relative distance determined from one.

19. The method of claim 18 wherein determining the relative distance along the curve comprises dividing the number of points along the curve at which the measured open circuit voltage is not greater than or equal to the correlated open circuit voltage by the total number of points along the curve.

20. The method of claim 12 further comprising displaying an indication of the charge state of the test battery.

21. A method of testing a rechargeable energy storage battery comprising:

applying a high current load pulse to a test battery;

after the applying, waiting a predetermined rest period;

after the waiting, measuring an open circuit voltage of the test battery;

after the waiting, measuring a dynamic parameter of the test battery; and determining at least one of a physical condition and a charge state of the test battery using the measured open circuit voltage, the measured dynamic parameter, and correlation data based on the dynamic parameter of at least one battery at at least one charge state.

22. The method of claim 21 wherein the at least one charge state comprises a single charge state, and further comprising indicating a failure condition if a determined physical condition of the test battery falls below the correlation data of the at least one battery.

23. The method of claim 21 wherein determining the charge state of the test battery comprises calculating a state of charge value and categorizing the state of charge value into one of a plurality of value ranges, each of the plurality of value ranges representing a different charge state.

24. The method of claim 21 wherein determining the charge state of the test battery is based on calculating a state of charge of the test battery.

25. The method of claim 24 wherein at least a portion of the correlation data is representative of at least one open circuit voltage versus amp hour removed curve, and wherein calculating a state of charge value comprises:
   determining the relative distance along the curve that the measured open circuit voltage becomes greater than or equal to the correlated open circuit voltage; and
   subtracting the relative distance determined from one.

26. The method of claim 25 wherein determining the relative distance along the curve comprises dividing the number of points along the curve at which the measured open circuit voltage is not greater than or equal to the correlated open circuit voltage by the total number of points along the curve.

27. A method of testing a rechargeable energy storage battery comprising:
   measuring an open circuit voltage of a test battery;
   measuring a dynamic parameter of the test battery;
   calculating a state of charge value using the measured open circuit voltage, the measured dynamic parameter, and correlation data based on the dynamic parameter of at least one battery at at least one charge state; and
   categorizing the state of charge value into one of a plurality of value ranges, each of the plurality of value ranges representing a different charge state.

28. The method of claim 27 further comprising displaying an indication of the charge state.

29. The method of claim 27 wherein at least a portion of the correlation data is representative of at least one open circuit voltage versus amp hour removed curve, and wherein calculating a state of charge value comprises:
   determining the relative distance along the curve that the measured open circuit voltage becomes greater than or equal to the correlated open circuit voltage; and
   subtracting the relative distance determined from one.

30. The method of claim 29 wherein determining the relative distance along the curve comprises dividing the number of points along the curve at which the measured open circuit voltage is not greater than or equal to the correlated open circuit voltage by the total number of points along the curve.

31. A method of testing a rechargeable energy storage battery, the method utilizing stored correlation data representative of at least one open circuit voltage versus amp hour removed curve for at least one battery, the method comprising:
   measuring an open circuit voltage for a test battery;
   determining the relative distance along the curve that the measured open circuit voltage becomes greater than or equal to the stored correlation data;
   calculating the state of charge of the test battery by subtracting the relative distance determined from one.

32. The method of claim 31 wherein determining the relative distance along the curve comprises dividing the number of points along the curve at which the measured open circuit voltage is not greater than or equal to the correlated open circuit voltage by the total number of points along the curve.

33. The method of claim 31 further comprising determining the charge state of the test battery based on the calculated state of charge.

34. The method of claim 33 further comprising displaying an indication of the charge state of the test battery.

* * * * *